(12) United States Patent
Saitoh

(10) Patent No.: US 6,803,809 B2
(45) Date of Patent: Oct. 12, 2004

(54) STEP-DOWN CIRCUIT FOR GENERATING A STABLE INTERNAL VOLTAGE

(75) Inventor: Yoshikazu Saitoh, Hamura (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/300,843

(22) Filed: Nov. 21, 2002

(65) Prior Publication Data

US 2003/0117115 A1 Jun. 26, 2003

(30) Foreign Application Priority Data

Dec. 25, 2001 (JP) .......................................... 2001-391235

(51) Int. Cl.[7] .................................................. G05F 1/46
(52) U.S. Cl. .......................... 327/541; 327/543; 323/313
(58) Field of Search ................................ 327/540, 541, 327/547; 323/313, 314

(56) References Cited

U.S. PATENT DOCUMENTS

| | | | | |
|---|---|---|---|---|
| 4,937,476 A | * | 6/1990 | Bazes | ........................... 326/71 |
| 5,252,909 A | * | 10/1993 | Aizaki | ........................... 323/313 |
| 2003/0001666 A1 | * | 1/2003 | Watanabe et al. | ........... 327/563 |

FOREIGN PATENT DOCUMENTS

| | | | |
|---|---|---|---|
| JP | 3-174811 | 11/1990 | ............. H03F/3/16 |
| JP | 5-252020 | 3/1992 | ....... H03K/19/0175 |
| JP | 10-22749 | 7/1996 | ............. H03K/3/45 |
| JP | 11-284447 | 1/1999 | ............. H03F/3/45 |

* cited by examiner

Primary Examiner—Timothy P Callahan
Assistant Examiner—Terry L. Englund
(74) Attorney, Agent, or Firm—Reed Smith LLP; Stanley P. Fisher, Esq.; Juan Carlos A. Marquez, Esq.

(57) ABSTRACT

The present invention provides a semiconductor integrated circuit device equipped with a negative feedback amplifier circuit or a step-down circuit which realizes stabilization of an output voltage effectively in response to a variation in power supply voltage. A constant current source is used to cause a bias current for setting current consumption to flow in a differential amplifying MOSFET. A capacitor is provided between an external power supply voltage and a predetermined circuit node to thereby detect a reduction in the external power supply voltage. An operating current of the differential amplifying MOSFET is increased through the use of a current flowing in the capacitor due to such an external power variation, thereby executing the operation of stabilizing an output voltage corresponding to the reduction in the external power supply voltage.

6 Claims, 14 Drawing Sheets

FIG. 20
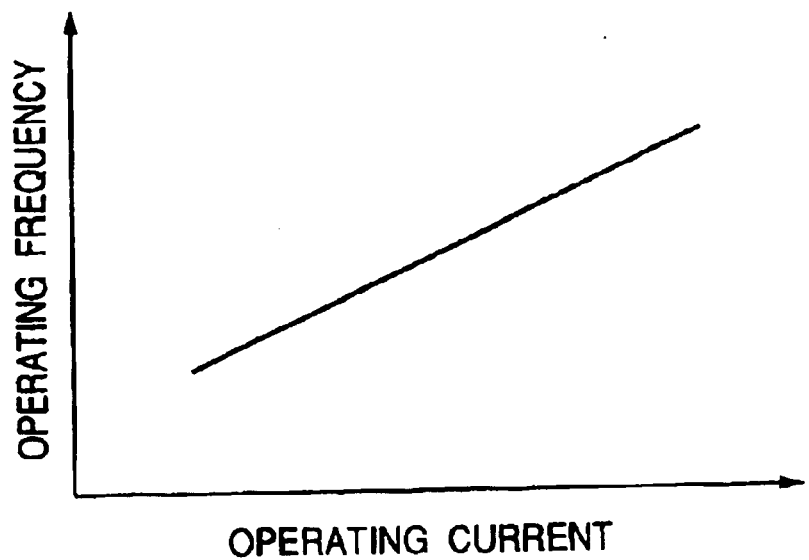
Prior Art FIG. 21
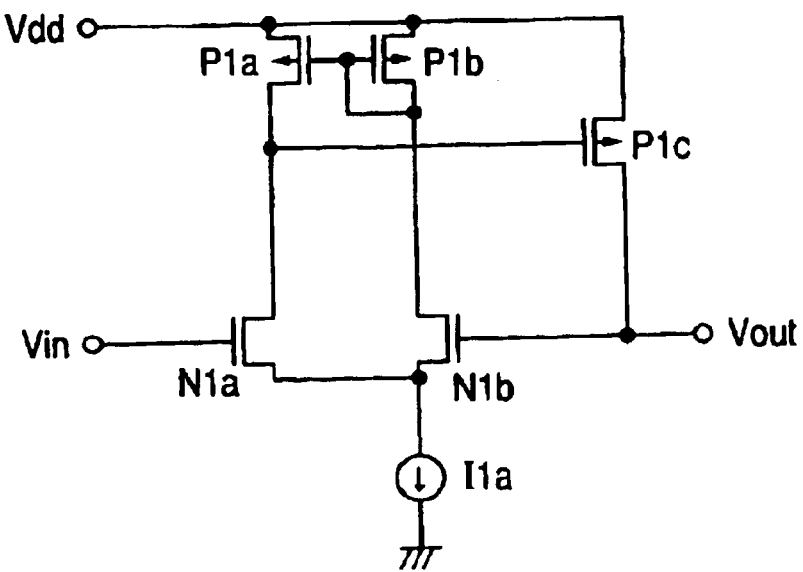

STEP-DOWN CIRCUIT FOR GENERATING A STABLE INTERNAL VOLTAGE

BACKGROUND OF THE INVENTION

The present invention relates to a semiconductor integrated circuit device, and to, for example, a technology effective for application to one equipped with a step-down power circuit for stepping down an external power supply voltage and supplying it to an internal circuit.

With advances in semiconductor processing technology, progress has been made toward reducing the size of each MOSFET and the size of a memory cell. Owing to the reduction in device size, a drop in operating voltage of the MOSFET has been performed in terms of problems such as a short channel effect and hot carriers, etc. On the other hand, an external supply source voltage of a semiconductor integrated circuit device is determined by a source or power supply voltage of a system equipped therewith. It is difficult to reduce such a system power supply voltage in association with the device size reduction that has been put forward in the semiconductor integrated circuit device. As means for filling the gap left between the system power supply voltage and the operating voltage of each MOSFET formed in the semiconductor integrated circuit device, a step-down circuit is provided for the semiconductor integrated circuit device to thereby step down an external power supply voltage corresponding to the system power supply voltage so as to fit to each MOSFET constituting an internal circuit.

Such a negative feedback amplifier circuit (voltage follower circuit) as shown in FIG. 21 is used as the step-down circuit. It is considered that as shown in FIG. 22, a reference voltage Vref formed by a constant voltage generating circuit is inputted to the negative feedback amplifier circuit where it is power-amplified to form an output voltage Vout, after which it is supplied to a load circuit (internal circuit) Z typified by a parallel circuit made up of a resistor and a capacitor as an operating voltage. As other examples of amplifier circuits using MOSFETs, there are known, Unexamined Patent Publication Nos. Hei 11(1999)-284447, Hei 3(1991)-174811, Hei 5(1993)-252020, Hei 10(1998)-22749, etc.

SUMMARY OF THE INVENTION

It is particularly desirable that in a semiconductor integrated circuit device installed in a portable electronic apparatus, its current consumption is reduced as small as practicable. Thus, the semiconductor integrated circuit device equipped with the step-down circuit needs to reduce current consumption of the step-down circuit as small as possible. However, the above-described negative feedback amplifier circuit such as shown in FIG. 21 needs to cause a bias current of several hundreds of $\mu A$ to flow through the use of a current source I1a for the purpose of initializing an internal voltage. There may be cases in which, for example, a semiconductor integrated circuit device installed in a portable electronic apparatus needs to set current consumption at standby with no operation to about $0.5\ \mu A$. A problem arises in that current consumption allowed for the step-down circuit to realize such low power consumption results in about 120 nA at most, and the step-down circuit cannot be installed in a semiconductor integrated circuit device intended for such low power consumption.

An object of the present invention is to provide a semiconductor integrated circuit device equipped with a negative feedback amplifier circuit or a step-down circuit which realizes stabilization of an output voltage effectively in response to a variation in power supply voltage. Another object of the present invention is to provide a semiconductor integrated circuit device equipped with a negative feedback amplifier circuit or a step-down circuit which implements enlargement of a source voltage operating range and stabilization of an output voltage. The above, other objects and novel features of the present invention will become apparent from the description of the present specification and the accompanying drawings.

Summaries of typical ones of the inventions disclosed in the present application will be described in brief as follows: A constant current source is used to cause a bias current for setting current consumption to flow in each differential amplifying MOSFET. A capacitor is provided between an external power supply voltage and a predetermined circuit node to thereby detect a reduction in the external power supply voltage. An operating current of the differential amplifying MOSFET is increased through the use of a current flowing in the capacitor due to such an external power variation, thereby executing the operation of stabilizing an output voltage corresponding to the reduction in the external power supply voltage.

Further, a constant current source is used to cause a bias current for setting current consumption to flow in each differential amplifying MOSFET. A capacitor is provided between a circuit node responsive to a variation in external power supply voltage, and a ground potential to thereby detect a rise in the external power supply voltage. An operating current of the amplifying MOSFET is increased through the use of a current flowing in the capacitor due to such a variation in external power supply voltage to thereby execute the operation of stabilizing an output voltage corresponding to the rise in the external power supply voltage.

BRIEF DESCRIPTION OF THE DRAWINGS

FIG. 20 is a characteristic diagram showing the relationship between an operating current and an operating frequency of a differential amplifier circuit; and FIG. 21 is a circuit diagram illustrating one example of a negative feedback amplifier circuit discussed in advance of the present invention.

DETAILED DESCRIPTION OF THE PREFERRED EMBODIMENTS

Figure 1:
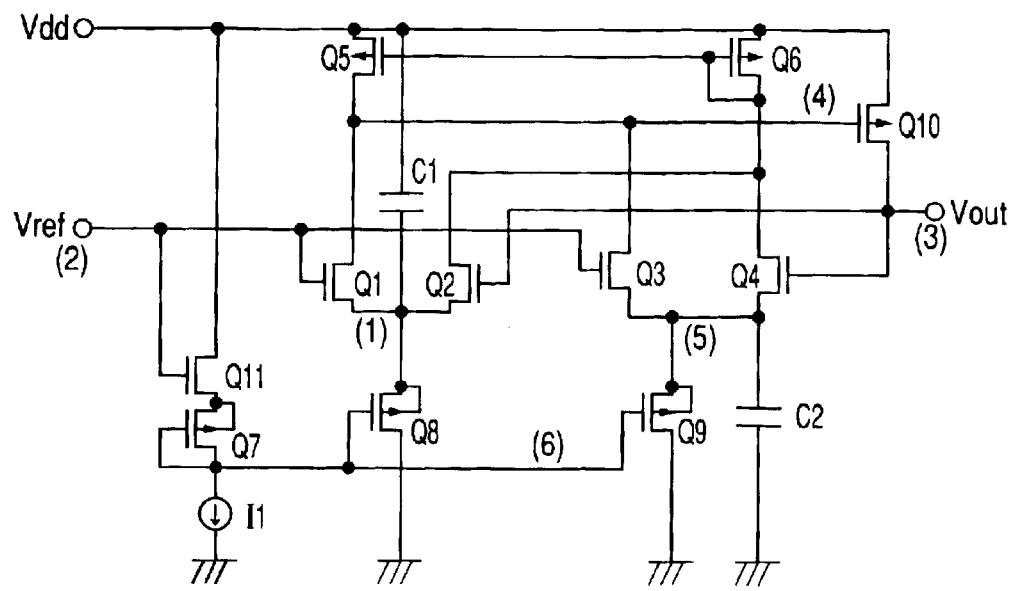
FIG. 1 is a circuit diagram showing one embodiment of a negative feedback amplifier circuit installed in a semiconductor integrated circuit device according to the present invention.

A circuit diagram of one embodiment of a negative feedback amplifier circuit installed in a semiconductor integrated circuit device according to the present invention is shown in FIG. 1. Respective circuit elements that constitute the present embodiment, are formed on a single substrate by the known CMOS semiconductor manufacturing technology together with other circuit elements that constitute the semiconductor integrated circuit device. The negative feedback amplifier circuit shown in the same drawing comprises a CMOS circuit made up of combinations of N-channel type MOSFETs and P-channel type MOSFETs. The P-channel type MOSFETs are distinguished from the N-channel type MOSFETs by marking their gates (channel portions) with arrows. This is similar even in the case of other circuit diagrams.

The negative feedback amplifier circuit according to the present embodiment constitutes a voltage follower circuit wherein its output voltage is fed back 100% to thereby power-amplify an input voltage (reference voltage) Vref so as to form or produce an output voltage Vout. Therefore, the negative feedback amplifier circuit performs a power amplifying operation so that the output voltage Vout becomes equal to the input voltage Vref. The output voltage Vout is used as an operating voltage for an unillustrated internal circuit.

A power supply voltage Vdd of the negative feedback amplifier circuit according to the present embodiment is set as an external source or power supply voltage supplied from an external terminal of the semiconductor integrated circuit device. Similarly, a ground terminal used as an external power terminal is provided in the semiconductor integrated circuit device and supplied with a ground potential. The negative feedback amplifier circuit is operated based on the power supply voltage Vdd and the ground potential. The input voltage Vref is set to a voltage lower than the external power supply voltage Vdd. Therefore, the voltage follower circuit configured by the negative feedback amplifier circuit according to the present embodiment functions as a stepdown power circuit which forms an internal voltage Vout obtained by stepping down the external power supply voltage Vdd.

The negative feedback amplifier circuit according to the present embodiment makes use of two pairs of differential circuits. The differential circuit used as the first pair or set comprises N-channel type differential MOSFETs Q1 and Q2 and a P-channel type MOSFET Q8 provided between their common sources and the ground potential. The differential circuit used as the other set comprises N-channel type differential MOSFETs Q3 and Q4 and a P-channel type MOSFET Q9 provided between their common sources and the ground potential.

A load circuit is provided commonly between the two pairs of differential circuits. The load circuit is made up of a current mirror circuit comprising a diode-connected P-channel type MOSFET Q6, and a P-channel type MOSFET Q5 to which the gate and source of the MOSFET Q6 are respectively commonly connected. The sources of the P-channel type MOSFETs Q5 and Q6 are supplied with the power supply voltage Vdd. The drains of the MOSFETs Q1 and Q3 of the one differential are connected in common and connected to the drain of the MOSFET Q5 on the output side of the current mirror circuit. The drains of the MOSFETs Q2 and Q4 of the other differential are connected in common and connected to the drain of the MOSFET Q6 on the input side of the current mirror circuit.

A signal outputted from the drain of the MOSFET Q5 on the output side of the current mirror circuit is transferred to the gate of a P-channel type output MOSFET Q10. The MOSFET Q10 functions as variable impedance means and steps down the power supply voltage Vdd through a source-to-drain or source-drain path to thereby form or produce an output voltage Vout. The gates of the MOSFETs Q1 and Q3 of the one differential, whose drains are commonly connected, are commonly supplied with the input voltage Vref. The gates of the MOSFETs Q2 and Q4 of the other differential, whose drains are commonly connected, are supplied with the output voltage Vout, whereby the voltage follower circuit given its feedback of 100% is established.

Although not restricted in particular, when the P-channel type MOSFETs Q8 and Q9 are used as MOSFETs for forming operating currents for the differential MOSFETs Q1, Q2 and Q3, Q4 as in the present embodiment, the following bias circuit is used to stably operate these P-channel type MOSFETs Q8 and Q9.

A constant current source I1 for setting a bias current is provided between the gate and drain of a P-channel type MOSFET Q7 which has the gate and drain connected in common and is provided in diode configuration, and the ground potential. The source of the MOSFET Q7 is connected to its corresponding source of an N-channel type MOSFET Q11 having its gate to which the input voltage Vref is applied. Although not restricted in particular, the drain of the MOSFET Q11 is connected to the power supply voltage Vdd.

In this configuration, the current formed by the constant current source I1 flows in a series circuit of the MOSFETs Q11 and Q7. The gate of the MOSFET Q7 is connected to the gates of the MOSFETs Q8 and Q9. The sources of the MOSFETs Q8 and Q9 are respectively connected to the common sources of the differential MOSFETs Q1, Q2 and Q3, Q4. The P-channel type MOSFETs Q7 through Q9 are formed of structures similar to one another, and the differential MOSFETs Q1 through Q4 and the MOSFET Q11 are formed of structures similar to one another. Further, they are formed in such a manner that their threshold voltages of the P-channel MOSFETs and N-channel type MOSFETs become equal to one another. It is thus possible to cause a current equivalent to the current flowing in the MOSFET Q7 to flow in each of the MOSFETs Q8 and Q9. If the MOSFETs Q8 and Q9 are formed so as to become equal in size to the MOSFET Q7, it is then possible to cause a current similar to the constant current formed by the constant current source I1 to flow in the MOSFETs Q8 and Q9.

Although not restricted in particular in the present embodiment, the current that flows in the MOSFETs Q7 through Q9, is set to an extremely small current of about 120 $\mu A$ or so for the purpose of low power consumption. The relationship between an operating current and an operating frequency employed in each differential amplifier circuit is represented as shown in FIG. 20. When the operating current is set small as described above, the operating frequency becomes extremely low, so that such an output MOSFET Q10 as to suppress a variation in system power supply, for example cannot be controlled, thus destabilizing the output voltage Vout.

In the present embodiment, a capacitor C1 is provided between the common sources of the differential MOSFETs Q1 and Q2 and the power supply voltage Vdd to stabilize the output voltage Vout with respect to a variation in the power supply voltage Vdd even where the operating current is less reduced as described above to provide low power consumption. The capacitor C1 is contrived so as to have the function of detecting a reduction in the power supply voltage Vdd and the function of causing a current produced due to the discharge operation of the capacitor C1 with the reduction in the power supply voltage Vdd to flow in the differential MOSFETs Q1 and Q2 to thereby provide a contribution to an improvement in operating frequency.

Owing to a closed loop expressed in the form of the input voltage Vref-gate of MOSFET Q1, source-source of MOSFET Q8, gate-gate of MOSFET Q7, source-source of MOSFET Q11, and gate-Vref, potentials at nodes at the sources and gates of the respective MOSFETs are balanced. Owing to a closed loop similar to the above even in the case of other differential MOSFETs Q3 and Q4, the sources of the MOSFETs Q3 and Q9 and the gate of the MOSFET Q9 are balanced in potential.

Figure 17:
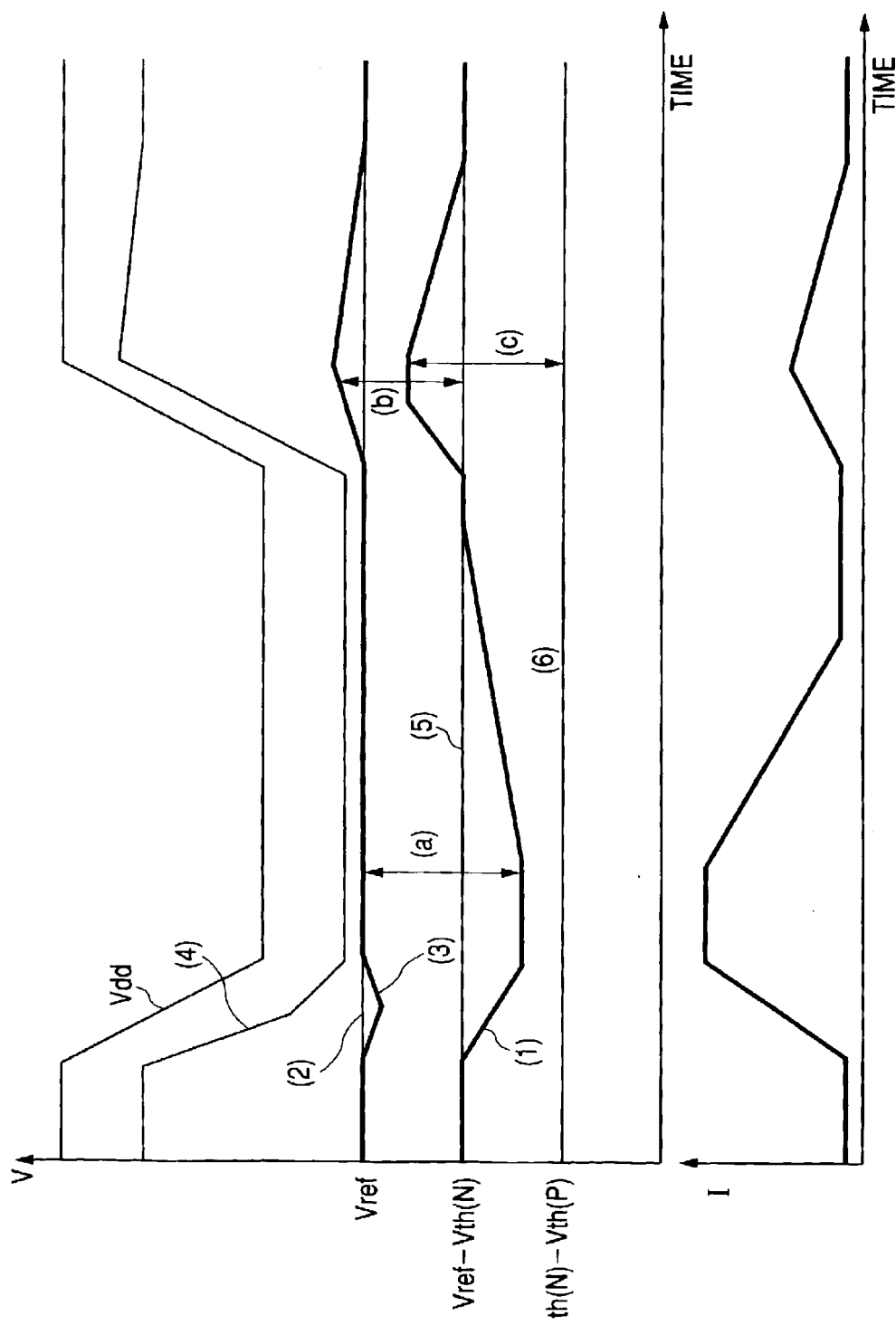
FIG. 17 is a waveform diagram for describing one example of the operation of the embodiment circuit shown in FIG. 1.

Thus, when the power supply voltage Vdd is lowered as shown in a waveform diagram of FIG. 17, the output voltage Vout from the differential circuits is also reduced in the differential circuits operated based on the operating currents formed by such MOSFETs Q8 and Q9 as described above. However, the potential at a node (1) for the common sources of the differential MOSFETs Q1 and Q2 is reduced due to coupling of the capacitor C1. Due to the reduction in the potential at the node (1), a voltage (a) larger than Vref–Vth (N) is applied between the gates and sources of the differential MOSFETs Q1 and Q2, so that the current flowing in each of the differential MOSFETs Q1 and Q2 increases. The Vth(N) indicates a threshold voltage of such an N-channel type MOSFET as typified by the MOSFET Q1.

Since only the MOSFET Q8-based current path for causing the constant current to flow is provided with respect to the common sources of the differential MOSFETs Q1 and Q2 as described above, an increase in the current flowing in each of the differential MOSFETs Q1 and Q2, corresponding to the above voltage (a) is covered by a discharge current of the capacitor C1 upon recovery to the balanced voltage (Vref–Vth(N)). Namely, the capacitor C1 combines the action of generating a discharge current developed upon recovery of the potential at the node (1) to the original balanced state with the action of transferring a reduction in the power supply voltage Vdd to the node (1).

Owing to the simple circuit configuration that one capacitor C1 is added to the differential amplifier circuit as in the present embodiment, the operating currents of the differential MOSFETs are increased to improve the operating frequencies necessary to detect the reduction in the power supply voltage and stabilize the output voltage Vout at this time, whereby a voltage (4) at a gate electrode of the output MOSFET Q10 is controlled with a high response to reduce a fall in the output voltage Vout (3).

Further, a capacitor C2 is provided between the common sources of the differential MOSFETs Q3 and Q4 and the ground potential. There is provided such a contrivance as to allow the capacitor C2 to have the function of indirectly detecting a rise in the power supply voltage Vdd through the output voltage Vout contrary to the above and the function of making a contribution to an improvement in operating frequency by an increase in current flowing in each of the differential MOSFETs Q3 and Q4 and an increase in current of the current source MOSFET Q9 with the rise in the output voltage Vout.

Namely, when the power supply voltage Vdd changes so as to rise as shown in the waveform diagram of FIG. 17, the output voltage Vout (3) also rises correspondingly. At this time, a potential (5) at the sources of the differential MOSFETs Q3 and Q4 is maintained at Vref–Vth(N) by the capacitor C2. Therefore, the voltage between the gate and source of the differential MOSFET Q4 is made large like a voltage (b) to thereby increase the current flowing in such an amplifying MOSFET Q4. Since only the MOSFET Q9 used as the current source is provided at the common sources of the differential MOSFETs Q3 and Q4 as mentioned above, the increase in the current flowing in the MOSFET Q4 is accommodated as a charge current of the capacitor C2.

When the potential of the node (5) for the common sources intends to rise owing to the charge current for the capacitor C2, the voltage between the gate and source of the MOSFET Q9 increases, so that the current flowing in the MOSFET Q9 increases. Namely, the operating current flowing in the differential MOSFET Q4 increases according to the increase in the output voltage Vout owing to the interaction between the differential MOSFET Q4, capacitor C2 and current source MOSFET Q9, so that the control voltage (4) supplied to the gate of the P-channel type MOSFET Q10 is raised so as to increase an on-resistance value, whereby the corresponding circuit is operated so as to suppress the rise in the output voltage Vout.

When such a power supply voltage Vdd rises, the capacitor Cl provided between the common sources of the differential MOSFETs Q1 and Q2 and the power supply voltage Vdd raises the potential at the node (1) for the common sources, so that the MOSFETs Q1 and Q2 are respectively brought to an off state. Besides, a large voltage like a voltage (c) is applied between the gate and source of the current source MOSFET Q8, so that the current flowing in such a MOSFET Q8 increases. As a result, the operation of charging the capacitor C1 can be performed at high speed by the current flowing in the MOSFET Q8. Namely, since the capacitor C1 responds at high speed according to the rise in the power supply voltage Vdd and completes its charge operation, the capacitor C1 is capable of detecting a reduction in the power supply voltage Vdd even when the power supply voltage Vdd is lowered immediately after the above operation, and the operating frequency of each differential MOSFET corresponding to it can be improved.

Owing to the provision of the capacitors C1 and C2 for the two differential circuits as described above, the operating currents of the differential MOSFETs Q1 and Q2 or Q3 and Q4 temporarily increase in response to the variations like the reduction and rise in the power supply voltage Vdd, and the operating frequencies thereof are improved. Thus, the operating currents set by the MOSFETs Q8 and Q9 can be reduced in anticipation of the temporary increases in the operating current by such capacitors C1 and C2, thereby making it possible to achieve a reduction in power consumption.

Figure 18:
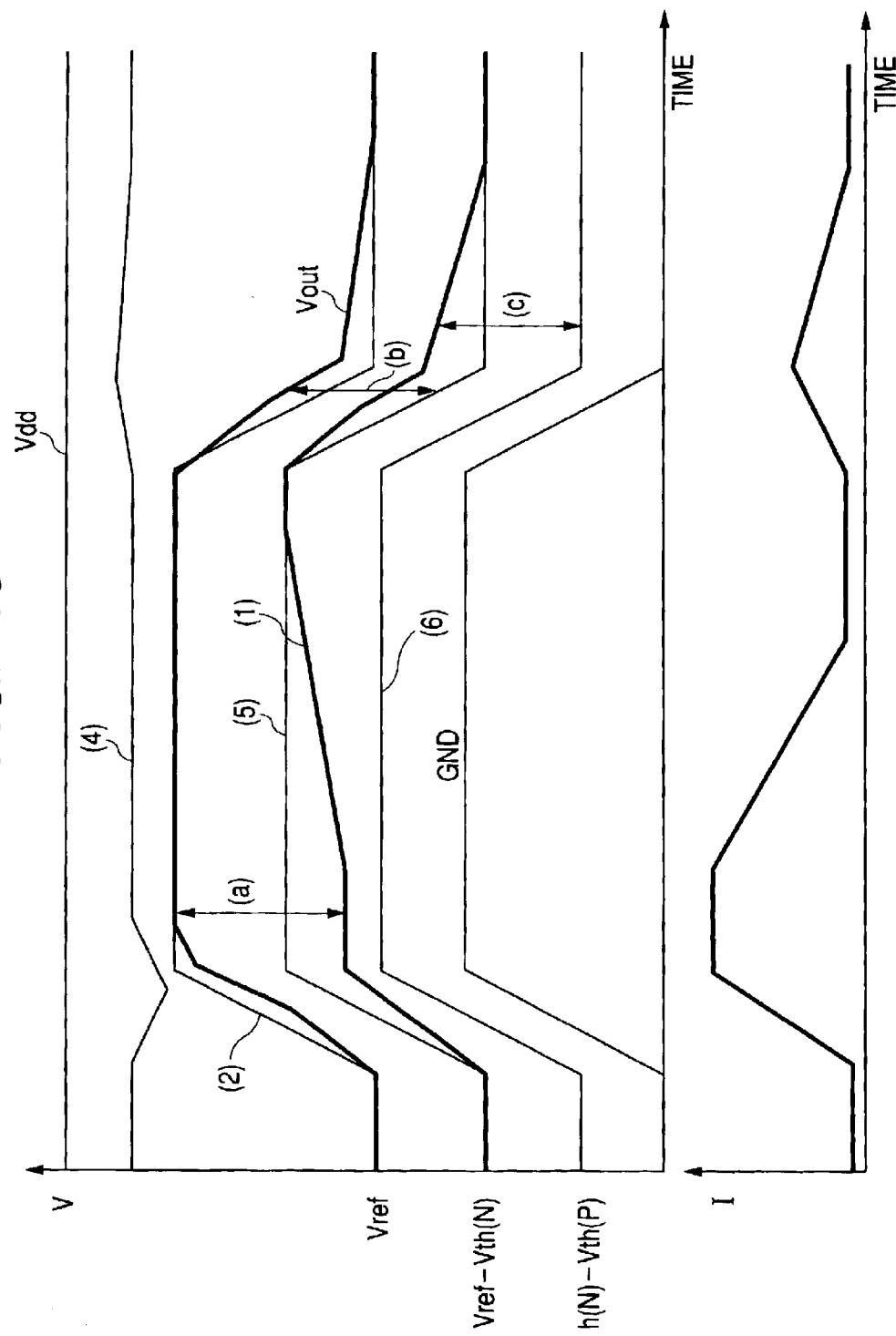
FIG. 18 is a waveform diagram for describing another example of the operation of the embodiment circuit shown in FIG. 1.

An operation waveform diagram of the embodiment circuit of FIG. 1 where the ground potential temporarily rises, is shown in FIG. 18. The operation of holding an output voltage Vout constant is made with the ground potential as the reference. Thus, the embodiment circuit shown in FIG. 1 performs an operation similar to FIG. 17 in which a power supply voltage Vdd is temporarily reduced. However, the operation of raising the output voltage Vout in association with a rise in the ground potential is performed to hold the output voltage Vout constant with the ground potential as the reference.

When the ground potential rises as the waveform diagram of FIG. 18, the potentials at nodes (2) and (6) with respect to an input voltage Vref formed with the ground potential as the reference also rise correspondingly. Further, the potential at the node (5) for the common sources of the differential MOSFETs Q3 and Q4 also rises in the same manner owing to the capacitor C2. However, a rise in the potential at the node (1) for the common sources of the differential MOSFETs Q1 and Q2 is prevented by the voltage held in the capacitor C1. Owing to the potential at the node (1), a voltage (a) larger than Vref−Vth(N) is applied between the gate and source of each of the differential MOSFETs Q1 and Q2, so that the current flowing in each of the differential MOSFETs Q1 and Q2 increases.

Since only the MOSFET Q8-based current path for causing the constant current to flow is provided with respect to the common sources of the differential MOSFETs Q1 and Q2 as described above, an increase in the current flowing in each of the differential MOSFETs Q1 and Q2, corresponding to the above voltage (a) is covered by a discharge current of the capacitor C1 upon recovery to the balanced voltage (Vref−Vth(N)). Namely, the capacitor C1 combines the action of generating a discharge current developed upon recovery of the potential at the node (1) to the original balanced state with the action of transferring the rise in the ground potential to the node (1).

Owing to the simple circuit configuration that one capacitor C1 is added to the differential amplifier circuit as in the present embodiment, the operating currents of the differential MOSFETs are increased to improve the operating frequencies necessary to detect the rise in the ground potential and stabilize the output voltage Vout at this time, whereby a voltage (4) at the gate electrode of the output MOSFET Q10 is controlled with a high response to raise the output voltage Vout (3) following the ground potential.

When the ground potential is lowered so as to return to the original state as shown in the waveform diagram of FIG. 18, the potential at the node (5) for the common sources of the differential MOSFETs is also reduced correspondingly. Therefore, the voltage between the gate of the differential MOSFET Q4 to which the output voltage Vout is applied, and the source thereof is made large like a voltage (b) to thereby increase the current flowing in such an amplifying MOSFET Q4. Since only the MOSFET Q9 used as the current source is provided at the common sources of the differential MOSFETs Q3 and Q4 as mentioned above, the increase in the current flowing in the MOSFET Q4 is accommodated as a charge current of the capacitor C2.

When the potential of the node (5) for the common sources intends to rise owing to the charge current for the capacitor C2, the voltage between the gate and source of the MOSFET Q9 increases, so that the current flowing in the MOSFET Q9 increases. Namely, an operating current flowing in the differential MOSFET Q4 increases according to the increase in the output voltage Vout owing to the interaction between the differential MOSFET Q4, capacitor C2 and current source MOSFET Q9 so that a control voltage (4) supplied to the gate of the P-channel type MOSFET Q10 is raised, whereby the corresponding circuit is operated so as to suppress the rise in the output voltage Vout.

When such a ground potential is lowered, the potential at the node (1) for the common sources is substantially raised by the voltage held by the capacitor C1 provided between the common sources of the differential MOSFETs Q1 and Q2 and the power supply voltage Vdd under a relative relationship with a reduction in the potential at the node (6), so that the MOSFETs Q1 and Q2 are respectively brought to an off state. Besides, a large voltage like a voltage (c) is applied between the gate and source of the current source MOSFET Q8, so that the current flowing in such a MOSFET Q8 increases. As a result, the operation of charging the capacitor C1 can be performed at high speed by the current flowing in the MOSFET Q8.

Namely, since the capacitor C1 responds to the reduction in the ground potential at high speed and completes its charge operation, the capacitor C1 is capable of detecting a reduction in the power supply voltage Vdd or a rise in the ground potential even when the power supply voltage Vdd is lowered and the ground potential rises as shown in FIG. 18 immediately after the above operation, and the operating frequency of each differential MOSFET can be improved correspondingly.

When the negative feedback amplifier circuit according to the present embodiment is used in a step-down circuit as a voltage follower configuration, the capacitor C2 can be omitted. Namely, when an operating voltage is formed for an internal circuit including a flip-flop circuit, and a memory circuit like a memory cell or the like by the step-down circuit, permission is not granted to reduce the operating voltage of each of the flip-flop circuit and the memory cell due to the reduction in the power supply voltage Vdd or the rise in the ground potential to thereby make it unable to maintain a memory operation. On the other hand, if such one as to bring about device breakdown is adopted even if the step-down circuit temporarily increases in potential, no substantial harm or damage occurs. Thus, if the negative feedback amplifier circuit is used in such a circuit that only a reduction in potential between an output voltage, i.e., a ground potential and an output terminal becomes a problem, as in the case of the step-down circuit or the like, for example, then the differential MOSFETs Q3 and Q4 and the capacitor C2 may be omitted.

Figure 2:
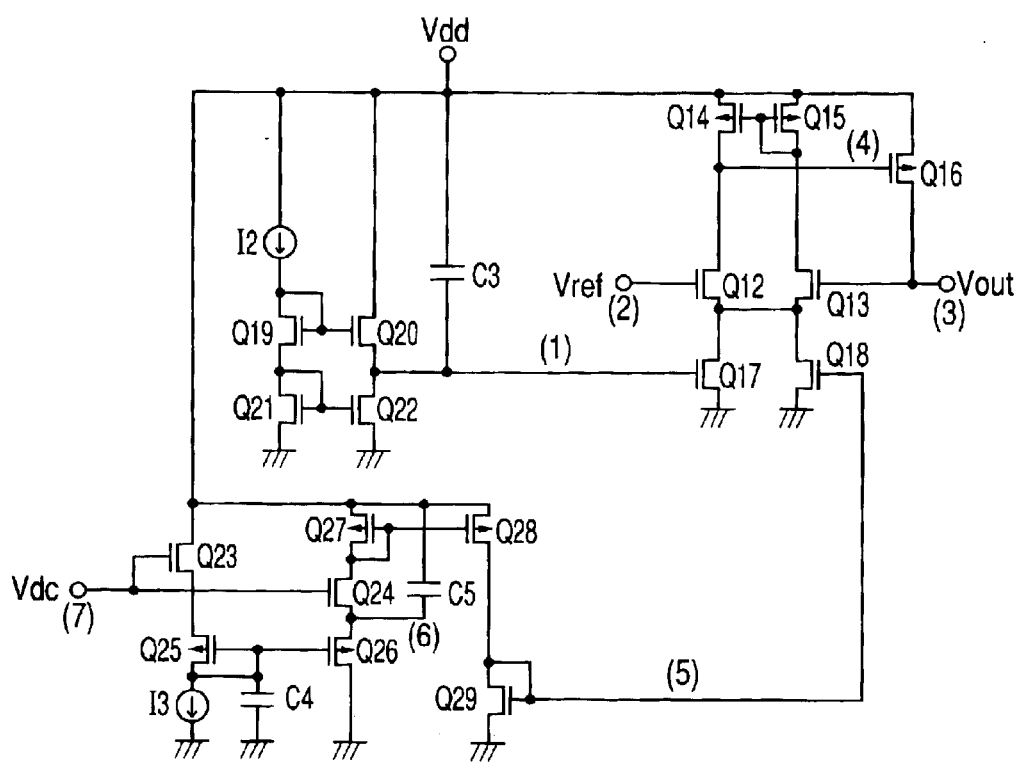
FIG. 2 is a circuit diagram illustrating another embodiment of a negative feedback amplifier circuit installed in a semiconductor integrated circuit device according to the present invention.

A circuit diagram of another embodiment of a negative feedback amplifier circuit installed in a semiconductor integrated circuit device according to the present invention is shown in FIG. 2. The negative feedback amplifier circuit according to the present embodiment takes such a contrivance as to reduce its lower-limit operating voltage. In the embodiment circuit shown in FIG. 1, there is a need to set the reference voltage Vref to a voltage larger than Vth(P)+Vth(N)+VI assuming that the threshold voltage of the P-channel type MOSFET is represented as Vth(P), the threshold voltage of the N-channel type MOSFET is represented as Vth(N), and the voltage applied across the current source I1 is represented as VI.

In the negative feedback amplifier circuit according to the present embodiment, two N-channel type current source MOSFETs Q17 and Q18 are respectively provided between common sources of differential MOSFETs Q12 and Q13 and a ground potential. P-channel type load MOSFETs Q14 and Q15 provided in a current mirror configuration and a P-channel type output MOSFET Q16 controlled by its output voltage are provided for the drains of the differential MOSFETs Q12 and Q13. The drain of the output MOSFET Q16 and the gate of the differential MOSFET Q13 are connected to each other, and the gate of the differential MOSFET Q12 is supplied with an input voltage (reference voltage) Vref, whereby a voltage follower circuit is configured.

The MOSFET Q17 is controlled by the following circuit so as to increase an operating current when a power supply voltage Vdd rises (ground potential is reduced). A current source I2 causes a bias current to flow in N-channel type MOSFETs Q19 and Q21 provided in diode configuration. The source of the MOSFET Q21 is supplied with the ground potential, and the current source I2 is provided between the gate and drain of the MOSFET Q19 and the power supply voltage Vdd. MOSFETs Q20 and Q22 whose gates are commonly connected to those of the MOSFETs Q19 and Q21, are provided for the MOSFETs Q19 and Q21. These MOSFETs Q20 and Q22 are connected in series. The source of the MOSFET Q22 is supplied with the ground potential and the drain of the MOSFET Q20 is supplied with the power supply voltage Vdd. A voltage (1) at a point where the MOSFETs Q20 and Q22 are connected to each other, is applied to the gate of the MOSFET Q17. A capacitor C3 is provided between such a connecting point and the power supply voltage Vdd.

In a manner similar to the circuit shown in FIG. 1, a current formed by the constant current source I2 flows in a series circuit of the MOSFETs Q19 and Q21. Since the gate of the MOSFET Q21 is connected to the gate of the MOSFET Q22 and the MOSFET Q20 is series-connected to the MOSFET Q22, the MOSFETs Q19 and Q20 and MOSFETs Q21 and Q22 are respectively formed of a similar structure and formed so that their threshold voltages become equal to each other. It is therefore possible to allow a current equivalent to a current which flows in the MOSFETs Q19 and Q21, to flow in the MOSFETs Q20 and Q22. Since a gate voltage equivalent to that of the MOSFET Q22 is applied to the gate of the MOSFET Q17, a current similar to the current formed by the constant current source I2 can be supplied even to the MOSFET Q17 if the MOSFETs Q21, Q22 and Q17 are made equal in size.

The MOSFET Q18 is controlled by the following circuit so as to increase an operating current when the power supply voltage Vdd is reduced (ground potential rises). A constant current source I3 for carrying or supplying a bias current is provided between the gate and drain of a P-channel type MOSFET Q25 configured in a diode form and the ground potential. A P-channel type MOSFET Q26 is provided in a current mirror configuration together with the MOSFET Q25. A capacitor C4 is provided between the gates of these MOSFETs Q25 and Q26 and the ground potential to stabilize a gate voltage.

The sources of the MOSFETs Q25 and Q26 are connected to their corresponding sources of N-channel type MOSFETs Q23 and Q24 which receive a constant voltage Vdc at their gates. Thus, the potentials at the sources of the P-channel type MOSFETs Q25 and Q26 are made equal to each other so that they perform a current mirror operation. The drain of the MOSFET Q23 is supplied with the power supply voltage Vdd, and a current mirror circuit comprising P-channel type MOSFETs Q27 and Q28 is provided between the drain of the MOSFET Q24 and the power supply voltage Vdd. A diode-connected N-channel type MOSFET Q29 is provided between the drain of the MOSFET Q28 and the ground potential. The MOSFET Q29 and the MOSFET Q18 are connected in the current mirror configuration.

In a manner similar to the circuit shown in FIG. 1, a current formed by the constant current source I3 flows in a series circuit of the MOSFETs Q23 and Q25. Since the gate of the MOSFET Q25 is connected to the gate of the MOSFET Q26 and the MOSFET Q25 is series-connected to the MOSFET Q26, the MOSFETs Q23 and Q24 and MOSFETs Q25 and Q26 are respectively formed of a similar structure and formed so that their threshold voltages become equal to each other. It is therefore possible to allow a current equivalent to a current which flows in the MOSFETs Q25 and Q23, to flow in the MOSFETs Q26 and Q24. If the MOSFET Q26 is formed so as to be equal in size to the MOSFET Q25, then a current similar to the constant current formed by the constant current source I3 can be supplied to the MOSFET Q26.

In order to detect a change in the power supply voltage Vdd and increase the operating current of each of the differential MOSFETs Q12 and Q13 correspondingly, a capacitor C5 is provided between a connecting point of the MOSFETs Q24 and Q26 and the power supply voltage Vdd even in the present embodiment. Although not restricted in particular, the current flowing in each of the MOSFETs Q17 and Q18 is set to an extremely small current of about 120 $\mu$A for the purpose of low power consumption even in the case of the present embodiment.

Figure 19:
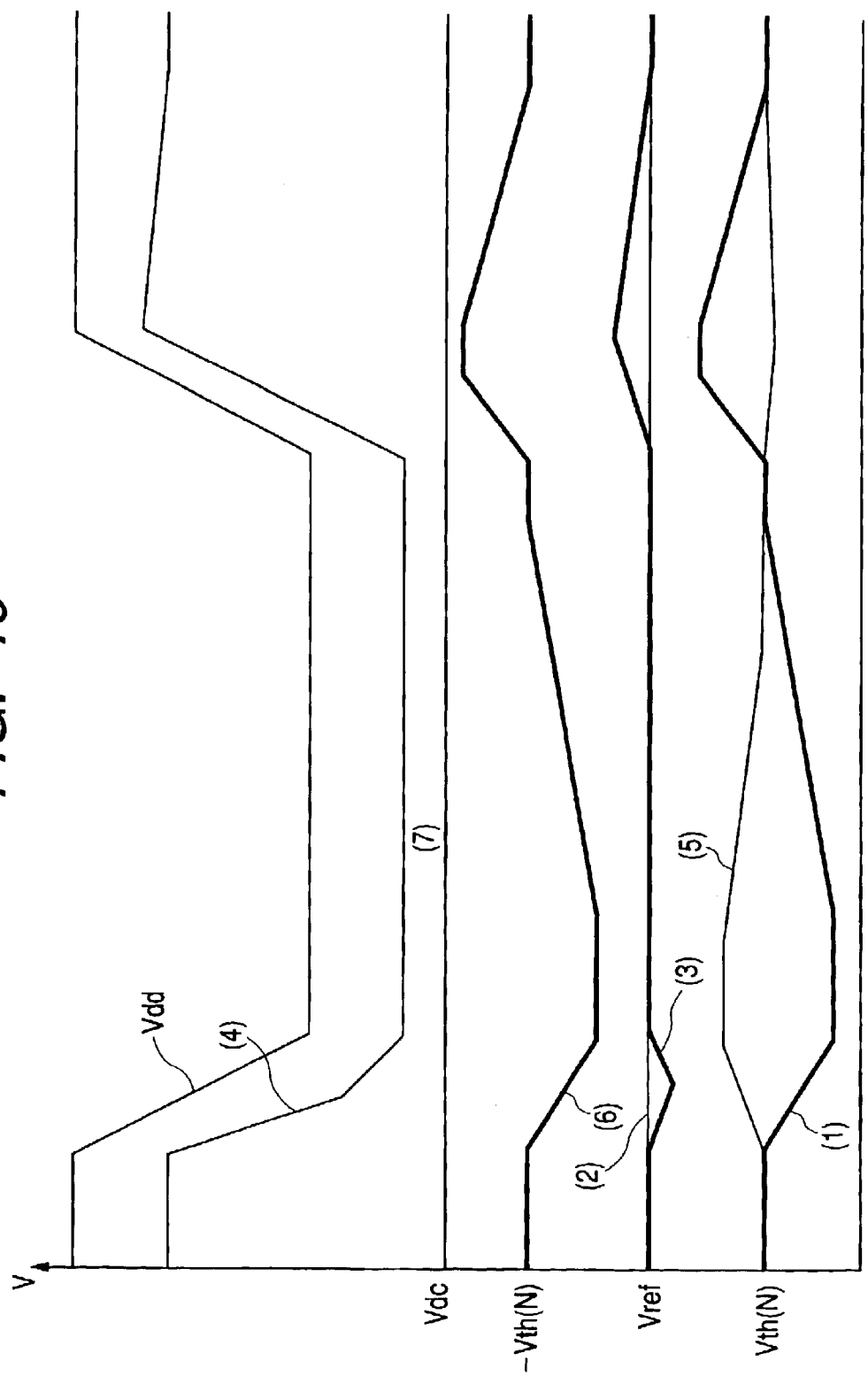
FIG. 19 is a waveform diagram for describing one example of the operation of the embodiment circuit shown in FIG. 2.
Figure 22:
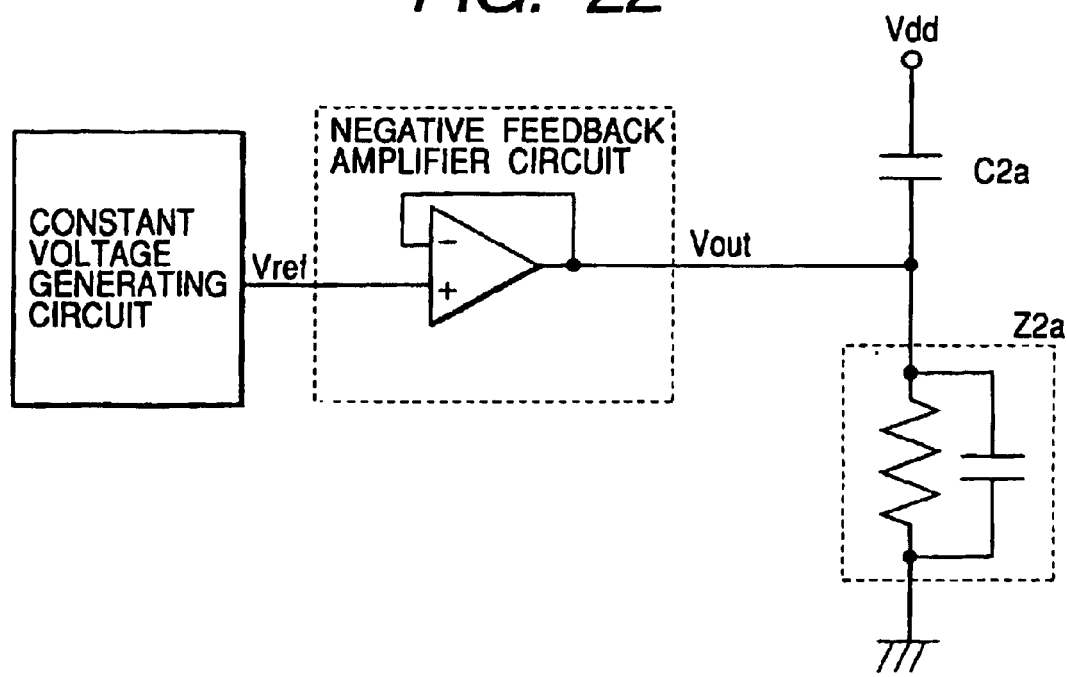
FIG. 22 is a circuit diagram depicting one example of a step-down circuit discussed in advance of the present invention.

A waveform diagram for describing one example of the operation of the embodiment circuit shown in FIG. 2 is shown in FIG. 19. When the power supply voltage Vdd is lowered as the waveform diagram of FIG. 19, a output voltage Vout of the differential circuit operated under the operating current formed by each of the above MOSFETs Q17 and Q18 is also reduced in the differential circuit.

However, the potential at a node (6) for the source of the P-channel type MOSFET Q26 is reduced due to coupling of the capacitor C5. Due to the reduction in the potential at the node (6), a voltage larger than Vdc−Vth(N) is applied between the gate and source of the MOSFET Q24, thereby increasing the current flowing in the MOSFET Q24.

Since only a MOSFET Q26-based current path for causing a constant current to flow is provided with respect to the source of the MOSFET Q24 as described above, an increase in the current flowing in the MOSFET Q24 is covered by a discharge current of the capacitor C5 upon recovery to the balanced voltage (Vdc−Vth(N)). The increase in current acts so as to increase the operating current of each of the differential MOSFETs Q12 and Q13 via the current mirror circuit of the MOSFETs Q27-Q28-Q29-Q18. Thus, the capacitor C5 combines the action of generating a discharge current developed upon recovery of the potential at the node (6) to the original balanced state to thereby increase the operating current of each of the differential MOSFETs Q12 and Q13 with the action of transferring a reduction in the power supply voltage Vdd to the node (6).

Owing to the execution of the increase in operating current of each differential MOSFET to improve the operating frequency necessary to detect the reduction in the power supply voltage Vdd and stabilize the output voltage Vout at this time as in the present embodiment, a voltage (4) at a gate electrode of the output MOSFET Q16 is controlled with a high response to make it possible to reduce a fall in the output voltage Vout (3).

When the power supply voltage Vdd is lowered, the potential at a node (1) is reduced by the capacitor C3. Accordingly, the current flowing in the MOSFET Q20 increases in a manner similar to the MOSFET Q24 so that the capacitor C3 is discharged to obtain the balanced voltage Vth(N).

When the power supply voltage Vdd changes so as to rise as shown in the waveform diagram of FIG. 19, the output voltage Vout (3) also rises correspondingly. At this time, the potential at the node (1) connected to its corresponding gate electrode of the MOSFET Q17 rises by coupling of the capacitor C3. With the potential rise at the node (1), the current flowing in the MOSFET Q17 increases and acts so as to increase the operating current of each of the MOSFETs Q12 and Q13. The operating currents of the differential MOSFETs Q12 and Q13 are increased to raise a control voltage (4) supplied to the gate of the P-channel type output MOSFET Q16, thereby increasing an on-resistance value and hence suppressing a rise in the output voltage Vout.

When such a power supply voltage Vdd rises, the potential at the node (6) for the source is raised by the capacitor C5 provided between the source of the MOSFET Q24 and the power supply voltage Vdd, so that the MOSFET Q24 is brought to an off state. Since the gate voltage is stable at Vdc−Vth(N)−Vth(P) which stays as it was, with respect to the rise in the source potential of the MOSFET Q26, the voltage between the gate and source of the current source MOSFET Q26 become great to increase the current flowing in the MOSFET Q26. As a result, the operation of charging the capacitor C5 can be performed at high speed by the current flowing in the MOSFET Q26. Namely, since the capacitor C5 responds at high speed according to the rise in the power supply voltage Vdd and completes its charge operation, the capacitor C5 is capable of detecting a reduction in the power supply voltage Vdd even when the power supply voltage Vdd is lowered immediately after the above operation, and the operating frequency of each differential MOSFET corresponding to it can be improved.

Owing to the provision of the capacitors C3 and C5 for the two differential circuits as described above, the operating currents of the differential MOSFETs Q12 and Q13 temporarily increase in response to the variations like the reduction and rise in the power supply voltage Vdd according to the above operations of the MOSFETs Q17 and Q18, and hence the operating frequencies thereof are improved. Thus, the operating currents set by the MOSFETs Q17 and Q18 can be reduced in anticipation of the temporary increases in the operating current by such capacitors C3 and C5, thereby making it possible to achieve a reduction in power consumption.

Another feature of the present embodiment resides in that the operating voltage Vdd can be reduced or the output voltage Vout can be lowered. As shown in FIG. 19, an input voltage (reference voltage) Vref may preferably be larger than the threshold voltage Vth(N) of each of the MOSFETs Q12 and Q13 or the like+the voltage between the source and drain of the MOSFET Q17. In other words, the input voltage can be set lower than the lowest voltage of the reference voltage employed in the embodiment of FIG. 1=Vth(P)+Vth(N)+VI. Incidentally, the threshold voltage Vth(P) of each P-channel type MOSFET is expressed in an absolute value.

Although the operation at a rise in the ground voltage is not described in particular in the embodiment shown in FIG. 2, the rise in the ground voltage is equivalent to the power supply voltage Vdd in a manner similar to the circuit of FIG. 1, and a reduction in the ground voltage is equivalent to the rise in the power supply voltage Vdd. Therefore, the operation of stabilization of the output voltage Vout is performed according to an operation similar to the embodiment circuit of FIG. 1.

Figure 3:
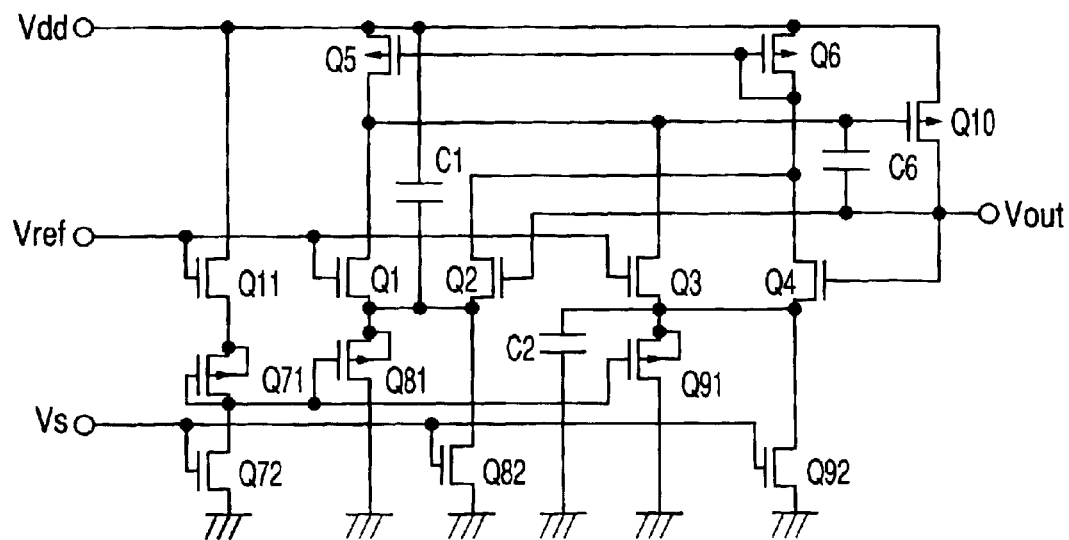
FIG. 3 is a circuit diagram depicting a further embodiment of a negative feedback amplifier circuit installed in a semiconductor integrated circuit device according to the present invention.

A circuit diagram showing a further embodiment of a negative feedback amplifier circuit installed in a semiconductor integrated circuit device according to the present invention is shown in FIG. 3. The present embodiment is a modification of the embodiment of FIG. 1 and principally different from the embodiment of FIG. 1 in terms of a current source circuit provided for each of common emitters of differential MOSFETs Q1, Q2 and Q3, Q4.

A MOSFT Q71 is one identical to the MOSFET Q7 shown in FIG. 1. A MOSFET Q72 series-connected to the MOSFET Q71 is supplied with a constant voltage Vs at its gate and hence constitutes the constant current source I1 of FIG. 1. In the present embodiment, N-channel type MOSFETs Q82 and Q92, which receive the constant voltage Vs at their gates, are provided. These MOSFETs Q82 and Q92 are respectively provided for common sources of the differential MOSFETs Q1, Q2 and Q3, Q4 so as to provide a constant current flow.

P-channel type current source MOSFETs Q81 and Q91 corresponding to the MOSFETs Q8 and Q9 employed in the embodiment of FIG. 1 are provided in a configuration parallel with these MOSFETs Q82 and Q92 so as to perform a current mirror operation equivalently in a manner similar to the embodiment of FIG. 1 together with the MOSFET Q17 constitutive of the bias circuit. A current obtained by combining the constant current formed by each of the N-channel type MOSFETs Q82 and Q92 and a variable current corresponding to a variation in power supply voltage Vdd by each of the P-channel type MOSFETs Q81 and Q91 is used as an operating current for each of the differential MOSFETs Q1, Q2 and Q3, Q4.

In the present embodiment, a phase compensating capacitor C6 for prevention of oscillations or the like is provided between the gate and drain of a P-channel type output MOSFET Q10 in addition to the change in the above-described current source circuit. Since the operation of the circuit according to the present embodiment is similar to the operation of the embodiment circuit shown in FIG. 1, the description thereof is omitted.

Figure 4:
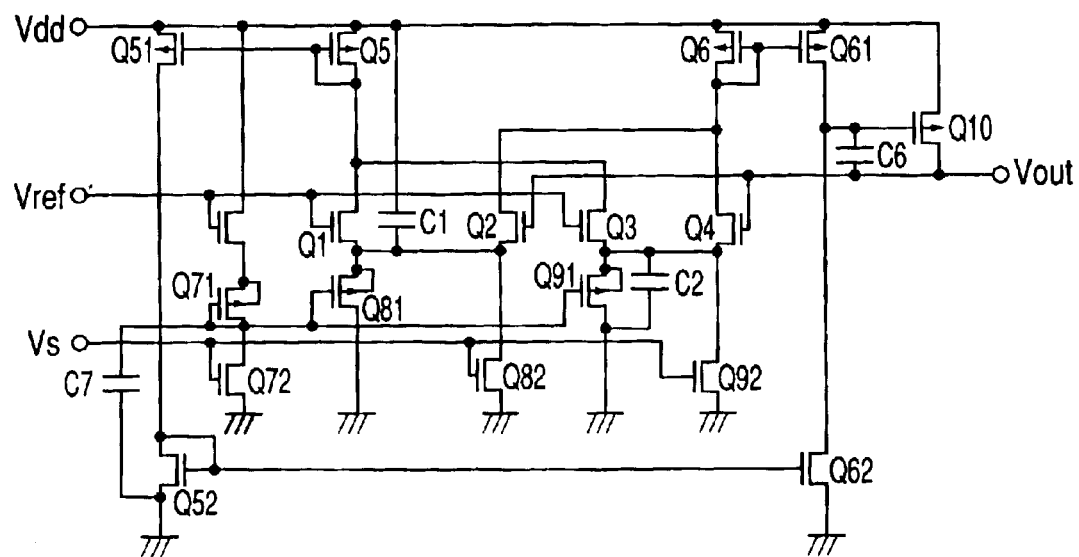
FIG. 4 is a circuit diagram showing a still further embodiment of a negative feedback amplifier circuit installed in a semiconductor integrated circuit device according to the present invention.

A circuit diagram showing a still further embodiment of a negative feedback amplifier circuit installed in a semiconductor integrated circuit device according to the present invention is shown in FIG. 4. The present embodiment is a modification of the embodiment shown in FIG. 3. A change to be made to the load circuit for the differential circuits is principally added to the embodiment circuit of FIG. 3.

In the present embodiment, P-channel type load MOSFETs Q5 and Q6 of differential circuits are provided as a push-pull output configuration without being connected in the current mirror configuration to thereby increase output amplitude of the differential circuits, in other words, signal amplitude of a control voltage applied to the gate of an output MOSFET Q10.

The P-channel type MOSFET Q5 is provided with a P-channel type MOSFET Q51 diode-connected and set in a current mirror configuration. The MOSFET Q51 changes an output current of the one differential circuit to a push current and allows it to flow in an N-channel type diode-connected MOSFET Q52 provided on the ground potential side. A MOSFET Q62 is connected to the MOSFET Q52 in the current mirror configuration.

Similarly, the P-channel type MOSFET Q6 is also provided with a P-channel type MOSFET Q61 diode-connected and provided in the current mirror configuration. A push-pull configuration is taken in such a manner that the MOSFET Q61 changes an output current of the other differential circuit to a push current, and the difference between the push current and a pull current formed by the MOSFET Q62 provided on the ground potential side is outputted. A push-pull circuit comprising these P-channel MOSFET Q61 and N-channel type MOSFET Q62 forms an amplified output signal to drive the P-channel type MOSFET Q10.

Owing to the use of such a push-pull output circuit, the output amplitude of the differential circuits is increased to allow efficient control on the output MOSFET Q10. In the present embodiment, a capacitor C7 is provided between the gates of MOSFETs Q71, Q81 and Q91 constituting the current source circuit and bias circuit and the ground potential to stabilize a voltage applied to the gates of the MOSFETs Q71, Q81 and Q91.

Figure 5:
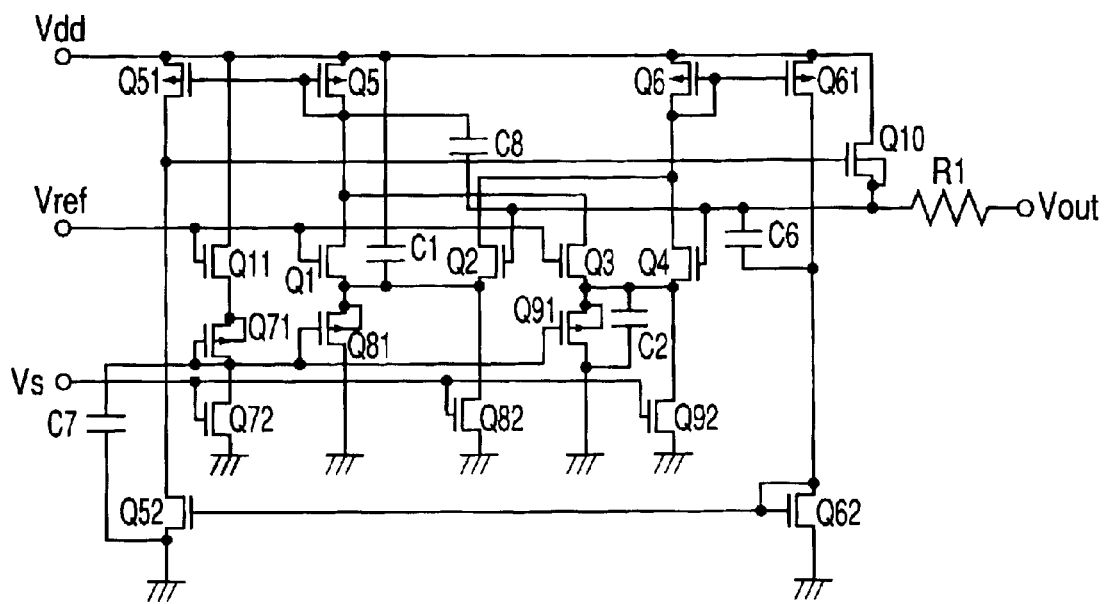
FIG. 5 is a circuit diagram illustrating a still further embodiment of a negative feedback amplifier circuit installed in a semiconductor integrated circuit device according to the present invention.

A circuit diagram illustrating a still further embodiment of a negative feedback amplifier circuit installed in a semiconductor integrated circuit device according to the present invention is shown in FIG. 5. The present embodiment is a modification of the embodiment of FIG. 3. In the present embodiment, changes to be made to the output circuit and phase compensating circuit are added to the embodiment circuit of FIG. 4.

In the present embodiment, an output MOSFET Q10 is configured as an N-channel type with respect to the embodiment circuit shown in FIG. 4. In association with it, a MOSFET Q62 is diode-connected as an alternative to a MOSFET Q52 in a differential circuit, and MOSFETs Q51 and Q52 constitute a push-pull output circuit. An output signal of such a push-pull output circuit is applied to the gate of the N-channel type output MOSFET Q10. The phase compensating circuit is provided with a resistor R1 inserted between the source of the output MOSFET Q10 and an output terminal Vout, and a capacitor C6 between a source output of the output MOSFET Q10 and a connecting point of the MOSFETs Q61 and Q62.

Figure 6:
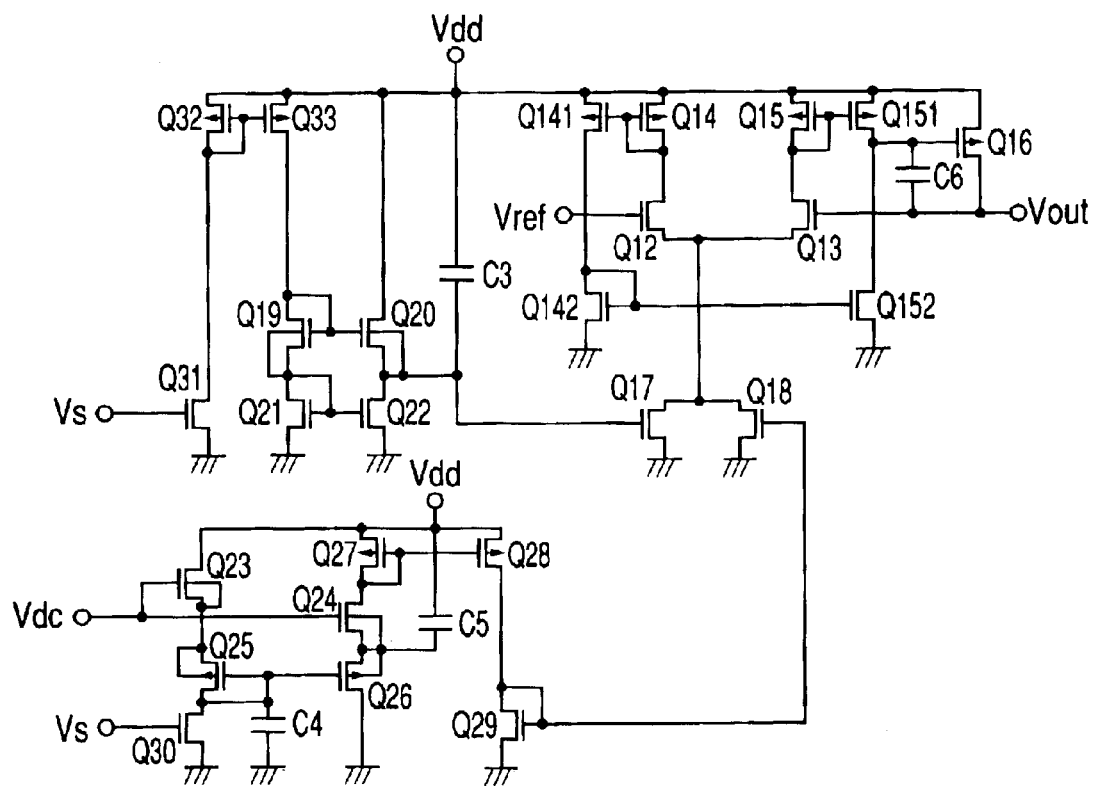
FIG. 6 is a circuit diagram showing a still further embodiment of a negative feedback amplifier circuit installed in a semiconductor integrated circuit device according to the present invention.

A circuit diagram showing a still further embodiment of a negative feedback amplifier circuit installed in a semiconductor integrated circuit device according to the present invention is shown in FIG. 6. The present embodiment is a modification of the embodiment shown in FIG. 2. A modification of an output section for differential circuits, and specific configurations of constant current sources I2 and I3 are illustrated with respect to the embodiment circuit shown in FIG. 2.

The output section of the differential circuits makes use of a push-pull circuit comprising MOSFETs Q14, Q141, Q142, Q15, Q151 and Q152 in a manner similar to FIGS. 4 and 5. It is thus possible to increase signal amplitude of a control voltage supplied to the gate of a P-channel type output MOSFET Q16.

An N-channel type MOSFET Q31, which receives a constant voltage Vs between the gate and source thereof, forms a current and supplies it to a current mirror circuit comprising P-channel type MOSFETs Q32 and Q33 provided on the side of a power supply voltage Vdd. The MOSFET Q33 is used as the constant current source I2 of FIG. 2. Similarly, an N-channel type MOSFET Q30, which receives the constant voltage Vs between the gate and source thereof, forms a constant current and is used as the constant current source I3 of FIG. 2.

Figure 7:
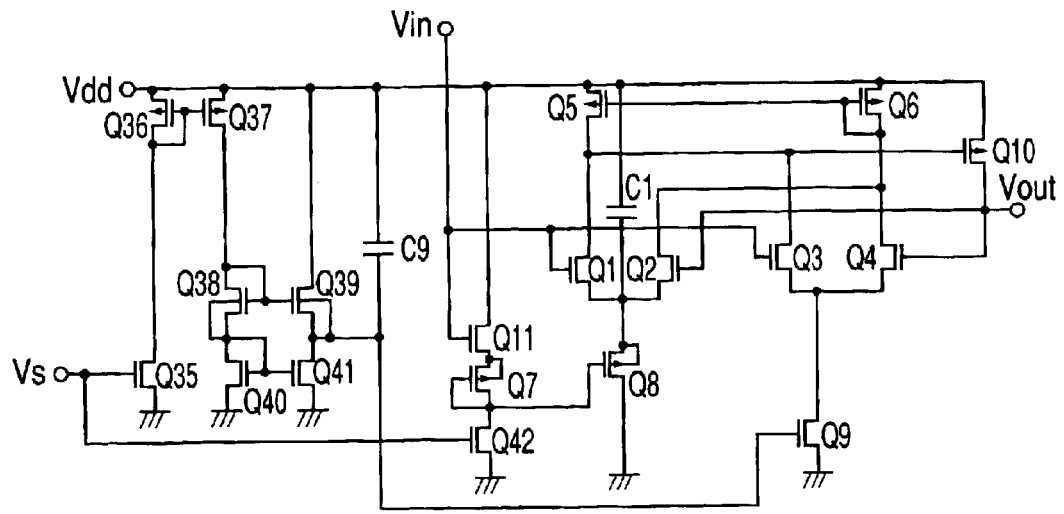
FIG. 7 is a circuit diagram depicting a still further embodiment of a negative feedback amplifier circuit installed in a semiconductor integrated circuit device according to the present invention.
Figure 9:
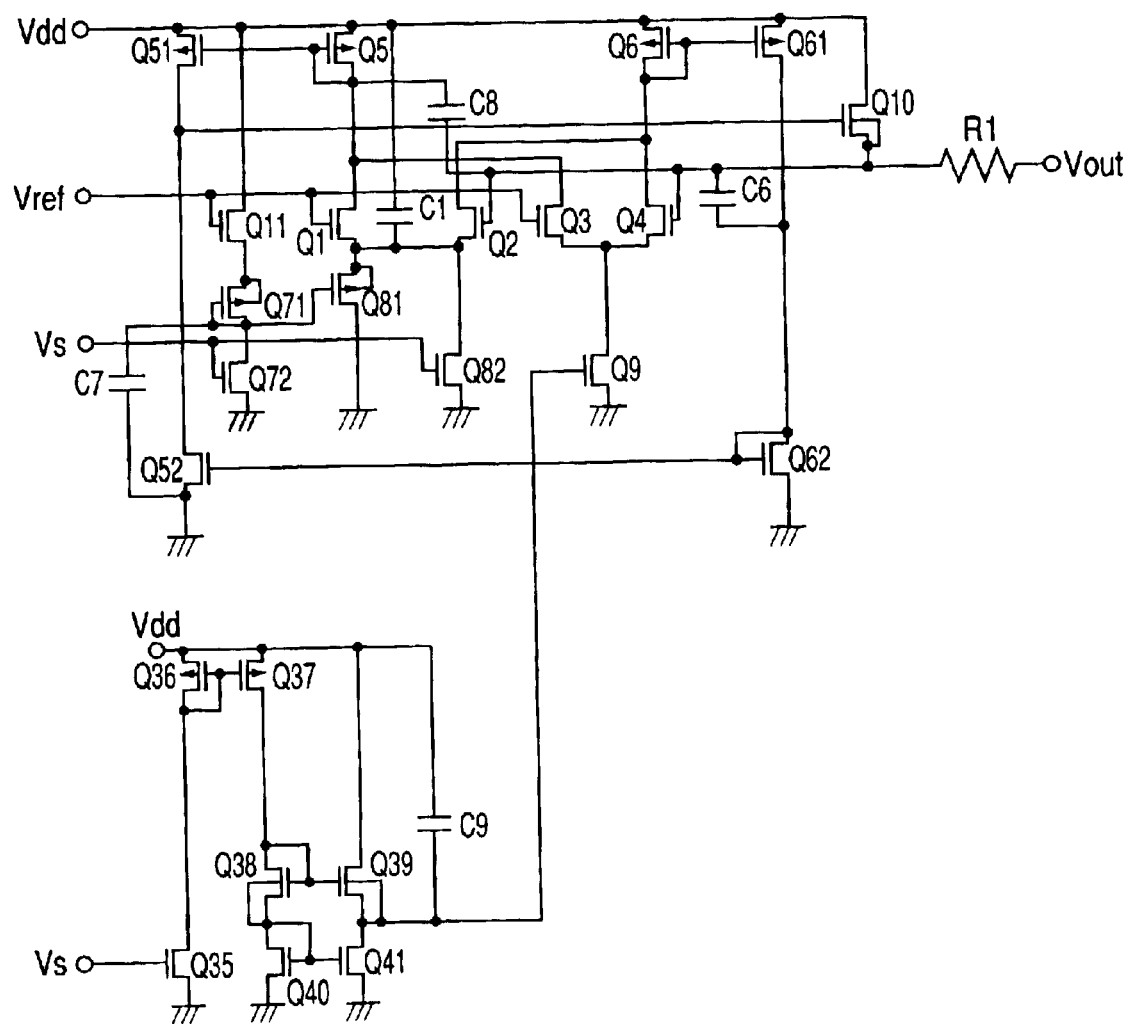
FIG. 9 is a circuit diagram illustrating a still further embodiment of a negative feedback amplifier circuit installed in a semiconductor integrated circuit device according to the present invention.

A circuit diagram depicting a still further embodiment of a negative feedback amplifier circuit installed in a semiconductor integrated circuit device according to the present invention is shown in FIG. 7. The present embodiment is a modification of the embodiment of FIG. 1. In connection with the embodiment of FIG. 1, the embodiment circuit of FIG. 6 is used for a circuit for detecting a rise in power supply voltage Vdd. Namely, the N-channel type MOSFET Q9 is provided between the common sources of the differential MOSFETs Q3 and Q4 and the ground potential. A circuit corresponding to the MOSFET Q17 of FIG. 9 is provided at the gate of the MOSFET Q9.

In a manner similar to FIG. 6, an N-channel type MOSFET Q35, which receives a constant voltage Vs between the gate and source thereof, forms a current and supplies it to a current mirror circuit comprising P-channel type MOSFETs Q36 and Q37 provided at a power supply voltage Vdd. The MOSFET Q37 is used as the constant current source I2 of FIG. 2. N-channel type MOSFETs Q38 and Q40 provided in diode configuration are caused to conduct the current referred to above. The source of the MOSFET Q40 is supplied with the ground potential. MOSFETs Q39 and Q41 whose gates are commonly connected to those of the MOSFETs Q38 and Q40, are provided for the MOSFETs Q38 and Q40. These MOSFETs Q39 and Q41 are connected in series. The source of the MOSFET Q41 is supplied with the ground potential. The drain of the MOSFET Q39 is supplied with the power supply voltage Vdd. The gate of the MOSFET Q38 is connected to the connecting point of the MOSFETs Q39 and Q41, and a capacitor C9 is provided between such a connecting point and the power supply voltage Vdd.

Figure 8:
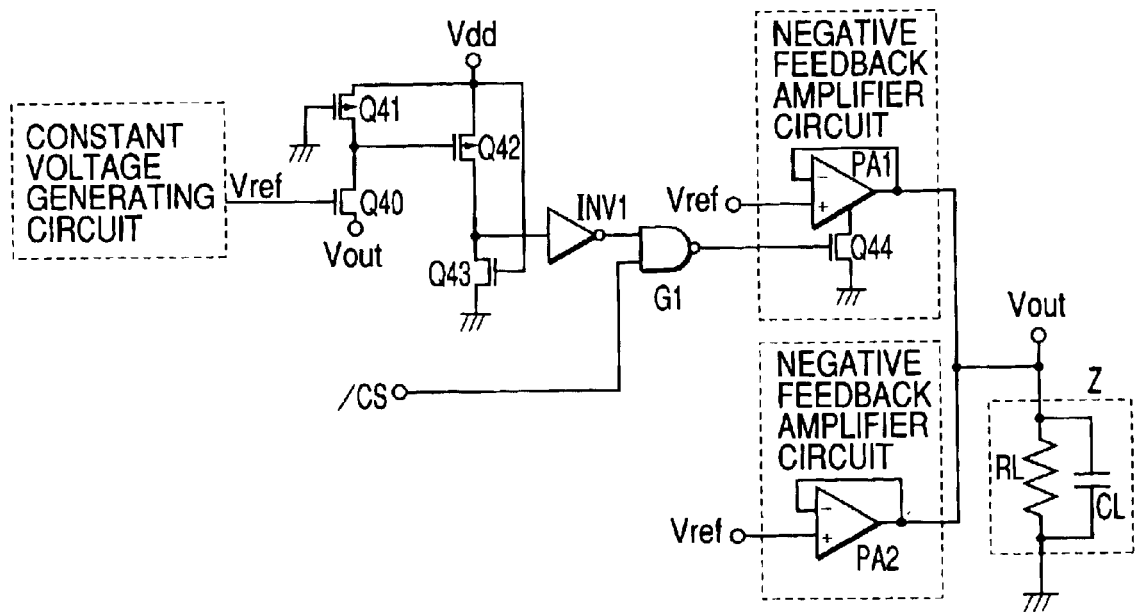
FIG. 8 is a circuit diagram showing one embodiment of a step-down circuit provided in a semiconductor integrated circuit device according to the present invention.

A circuit diagram showing one embodiment of a step-down circuit provided in a semiconductor integrated circuit device according to the present invention is shown in FIG. 8. The step-down circuit according to the present embodiment basically comprises a constant voltage generating circuit for forming or producing a reference voltage Vref set in association with a step-down voltage Vout, and two negative feedback amplifier circuits PA1 and PA2. The step-down circuit forms an operating voltage (step-down voltage) Vout supplied to an internal circuit expressed in an equivalent circuit comprising a resistor RL and a capacitor CL.

The semiconductor integrated circuit device carries relatively large current consumption according to the operation of its internal circuit when the internal circuit is in an active state. The internal circuit changes in current consumption too according to its operating state and changes with its high frequency. In order to stabilize the step-down voltage Vout corresponding to the operating voltage of such an internal circuit with respect to a change in operating current thereof, the negative feedback amplifier circuit PA1 is designed so that a sufficient bias current is formed by a MOSFET Q44. For example, the bias current is set to about several hundreds of $\mu A$.

When the internal circuit is in the active state as described above, the current consumed or used up by the internal circuit increases. Even if a bias current of several hundreds of $\mu A$ is set to the step-down circuit, its ratio is low. Thus, it is advisable to take voltage step-down rather than to increase such current consumption with the provision of such a step-down circuit in order to avoid the problems of the short channel effect and hot carriers with the above micro-fabrication of each MOSFET.

However, if such a current of several hundred of $\mu A$ continues to flow in the step-down circuit when the internal circuit of the semiconductor integrated circuit device is set to a standby state, then it greatly exceeds a standby current required for a battery-driven portable small-sized electronic apparatus. Therefore, if the semiconductor integrated circuit device is set to the standby state through the use of, for example, a signal like a chip select signal/CS, then the MOSFET Q44 is brought to an off state to suppress low or degrade the operation of the negative feedback amplifier circuit PA1.

The negative feedback amplifier circuit PA2 is provided to form the step-down voltage of the internal circuit when the negative feedback amplifier circuit PA1 is deactivated in this way, in other words, when the semiconductor integrated circuit device is brought to the standby state. The negative feedback amplifier circuit PA2 comprises such an embodiment circuit as typified by each of FIGS. 1 and 2, and its operating current is narrowed down to about 120 $\mu A$ or so as described above. Since only a leak current basically flows in the internal circuit when the semiconductor integrated circuit device is in the standby state, the operation of simply compensating for a reduction in the step-down voltage Vout due to the leak current may be performed.

In the above-described portable electronic apparatus, all the functions are not provided for one semiconductor integrated circuit device. In general, a system is made up of a plurality of semiconductor integrated circuit devices constituting peripheral circuits like a memory, etc. with a control device like a CPU or the like as the center. One system normally shares a power supply voltage Vdd and a ground potential used for the plurality of semiconductor integrated circuit devices. When one semiconductor integrated circuit device is brought to a standby state, other semiconductor integrated circuit devices are normally rendered active.

Thus, when other semiconductor integrated circuit devices are rendered active where the operating voltage of the internal circuit is maintained by the negative feedback amplifier circuit PA2 in the semiconductor integrated circuit device brought to the standby state, noise is produced in the power supply voltage Vdd and ground potential of the system, so that the power supply voltage Vdd and ground potential for the semiconductor integrated circuit device held in the standby state vary. Thus, the negative feedback amplifier circuit, which performs a step-down operation in the semiconductor integrated circuit device held in the standby state, needs to have the function of stabilizing the step-down voltage supplied to the internal circuit with respect to such variations in the power supply voltage Vdd and ground potential.

The negative feedback amplifier circuit typified by each of FIGS. 1 and 2 has the function of stabilizing the step-down voltage supplied to the internal circuit with respect to the variations in the power supply voltage Vdd and ground potential as mentioned above. Further, the negative feedback amplifier circuit is capable of providing extremely small stand-by current consumption and is configured as one suitable as the negative feedback amplifier circuit PA2 of such a step-down circuit as described in the present embodiment.

If only the leak current flows in the internal circuit in the semiconductor integrated circuit device held in the standby state, and the variations in the power supply voltage Vdd and ground potential are simply handled, then the step-down voltage Vout can be stabilized by the negative feedback amplifier circuit PA2. However, part of the internal circuit has the potential to temporarily perform an unexpected operation due to noise burst-in or the like. When the power supply voltage Vdd and the ground potential are constant and only the step-down voltage Vout varies in this case, the negative feedback amplifier circuit PA2 does not have the function of increasing the operating current as when the power supply voltage Vdd and the like vary.

Thus, when the power supply voltage Vdd and the ground potential are constant as described above and only the step-down voltage Vout varies, the operating voltage of the internal circuit greatly drops and a relatively long time interval is required to recover it. One in which a memory circuit like a register, a memory cell or the like is included in the internal circuit, is accompanied by a problem that if the operating voltage of the internal circuit drops deep as described above and a relatively long time interval is required to recover it, then memory information to be held will be lost.

When a circuit for detecting the step-down voltage Vout is provided in the present embodiment, and the step-down voltage Vout is reduced as described above, the negative feedback amplifier circuit is brought to an operating state regardless of a standby state to thereby promptly recover the above variation in the step-down voltage Vout and achieve its stabilization.

The gate of a MOSFET Q40 is supplied with a reference voltage Vref, and the source thereof is supplied with a step-down voltage Vout. A P-channel type MOSFET Q41 operated as a negative resistor by its gate being supplied with the ground potential is provided between the drain of the MOSFET Q40 and the power supply voltage Vdd. If Vref−Vout<Vth(N), then the MOSFET Q40 is brought to an off state and if Vref−Vout>Vth(N), then the MOSFET Q40 is brought to an on state, so that the operation of detecting the step-down voltage Vout using the threshold voltage Vth(N) is made possible.

The MOSFET Q41 forms a voltage signal in response to the on state/off state of the MOSFET Q40. The voltage signal is amplified by an inverting amplifier circuit comprising a P-channel type MOSFET Q42 constituting an amplifying element and an N-channel type MOSFET Q43 constituting a load element and further inverted and amplified by a CMOS inverter circuit INV1, whereby a voltage detect signal is formed.

The voltage detect signal and the chip select signal/CS are inputted to a NAND gate circuit G1, so that the MOSFET Q44 for forming the operating current of the negative feedback amplifier circuit PA1 is controlled by a signal outputted from the NAND gate circuit G1. Namely, even in the case of the active state of the semiconductor integrated circuit device in which the chip select signal/CS is rendered low in level, and the standby state of the semiconductor integrated circuit device in which the chip select signal/CS is rendered high in level, the negative feedback amplifier circuit PA1 is brought to an operating state upon the reduction in the step-down voltage Vout to thereby powerfully stabilize the step-down voltage Vout.

A circuit diagram illustrating a still further embodiment of a negative feedback amplifier circuit installed in a semiconductor integrated circuit device according to the present invention is shown in FIG. 9. The present embodiment is a modification of the embodiment shown in FIG. 5 or 7. A current source MOSFET provided at common emitters of differential MOSFETs Q1 and Q2, its control circuit and an output circuit section provided at the differential MOSFETs Q1, Q2 and Q3, Q4 correspond to the embodiment circuit of FIG. 5. A current source MOSFET provided at common emitters of the differential MOSFETs Q3 and Q4, and a control circuit thereof are associated with the circuit according to the embodiment of FIG. 7.

Figure 10:
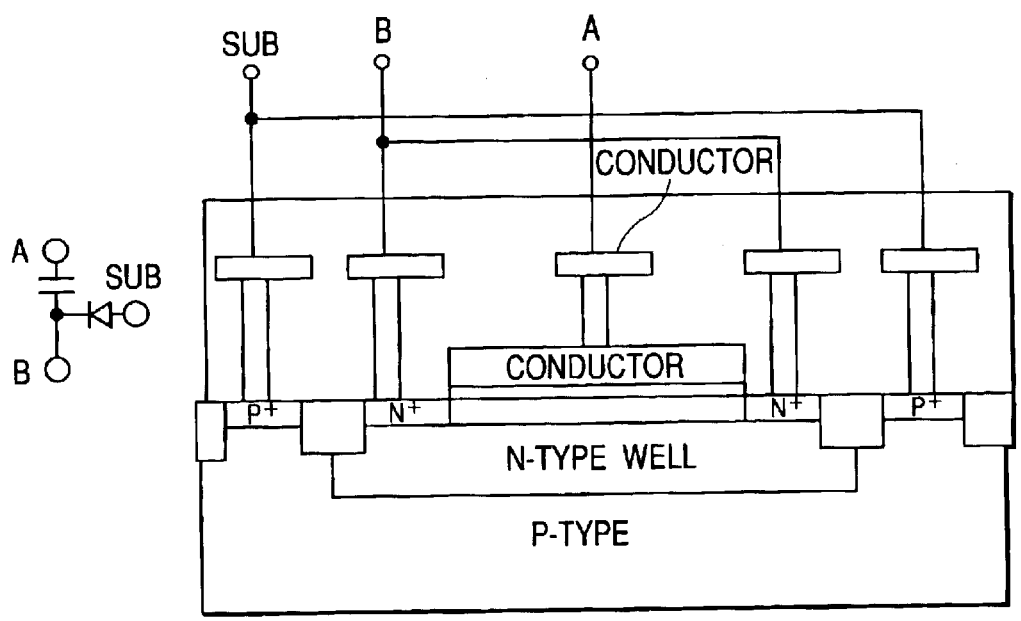
FIG. 10 is a device structure sectional view depicting one embodiment of a capacitor provided in a semiconductor integrated circuit device according to the present invention.

A device structure sectional view depicting one embodiment of a capacitor provided in a semiconductor integrated circuit device according to the present invention is shown in FIG. 10. The capacitor according to the present embodiment is principally used to detect variations in power supply voltage Vdd and ground potential and increase an operating current of the negative feedback amplifier circuit, corresponding to it as in the capacitors C1 and C2 or the like provided in the negative feedback amplifier circuit. Further, the capacitor may be one used to stabilize the bias voltage as in the capacitor C4 or the like as needed, and compensate for the phase as in the capacitor C6.

The capacitor according to the present embodiment makes use of a MOS capacitor. Although not restricted in particular, a conductor similar to a gate electrode of a MOSFET is provided on an N-type WELL (well) region formed on the surface of a P-type semiconductor substrate with a thin insulating film similar to a gate insulating film for each MOSFET being interposed therebetween. The conductor is configured as one electrode A of the capacitor. N+ type diffusion layers are formed at a peripheral portion of the N-type WELL, which is configured as the other electrode B of the capacitor. The MOS capacitor is configured with the conductor and the N-type WELL as both electrodes and the insulating film interposed therebetween as a dielectric material. Incidentally, the P-type semiconductor substrate is supplied with a substrate bias voltage SUB like the ground potential. A P+ diffusion layer is provided on a substrate surface to supply the voltage SUB.

Figure 11:
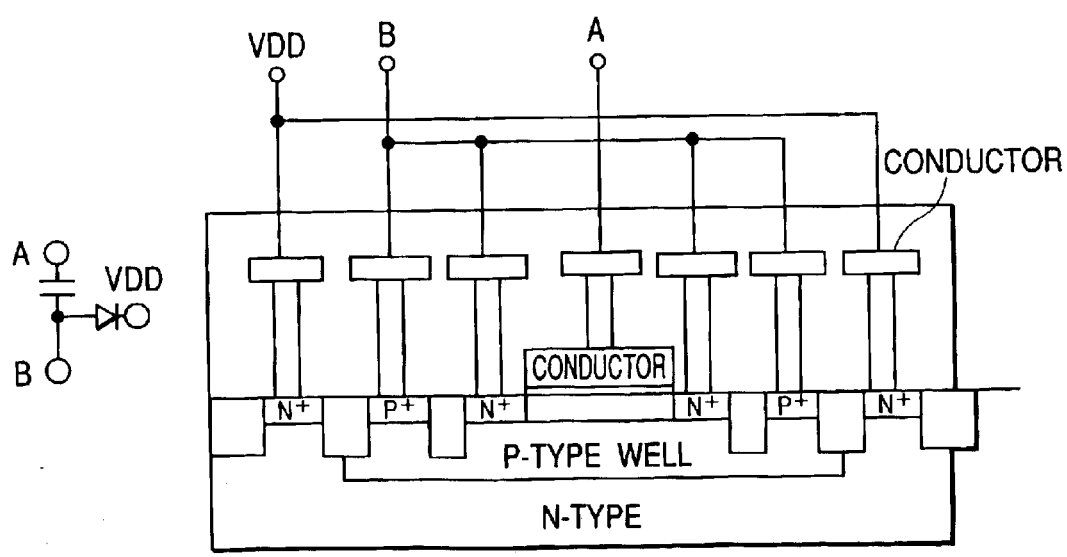
FIG. 11 is a device structure sectional view showing another embodiment of a capacitor provided in a semiconductor integrated circuit device according to the present invention.

A device structure sectional view showing another embodiment of a capacitor provided in a semiconductor integrated circuit device according to the present invention is shown in FIG. 11. The capacitor according to the present embodiment also makes use of a MOS capacitor. Although not restricted in particular, a conductor similar to a gate electrode of a MOSFET is provided on an P-type WELL (well) region formed on the surface of an N-type semiconductor substrate with a thin insulating film similar to a gate insulating film for a MOSFET being interposed therebetween. The conductor is configured as one electrode A of the capacitor. N+ diffusion layers similar to the source and drain of the MOSFET are provided on both sides of the conductor. P+ type diffusion layers for supplying a bias voltage to the P-type WELL are formed at a peripheral portion of the N-type WELL and connected by a wiring made up of a conductor together with the N+ diffusion layers. The P+ type diffusion layers are configured as the other electrode B of the capacitor. The MOS capacitor is configured with the conductor and a channel formed on the surface of the P-type WELL as both electrodes and the insulating film interposed therebetween as a dielectric material. Incidentally, the P-type semiconductor substrate is supplied with a bias voltage like a power supply voltage VDD. An N+ diffusion layer is provided on a substrate surface to supply the voltage VDD.

Figure 12:
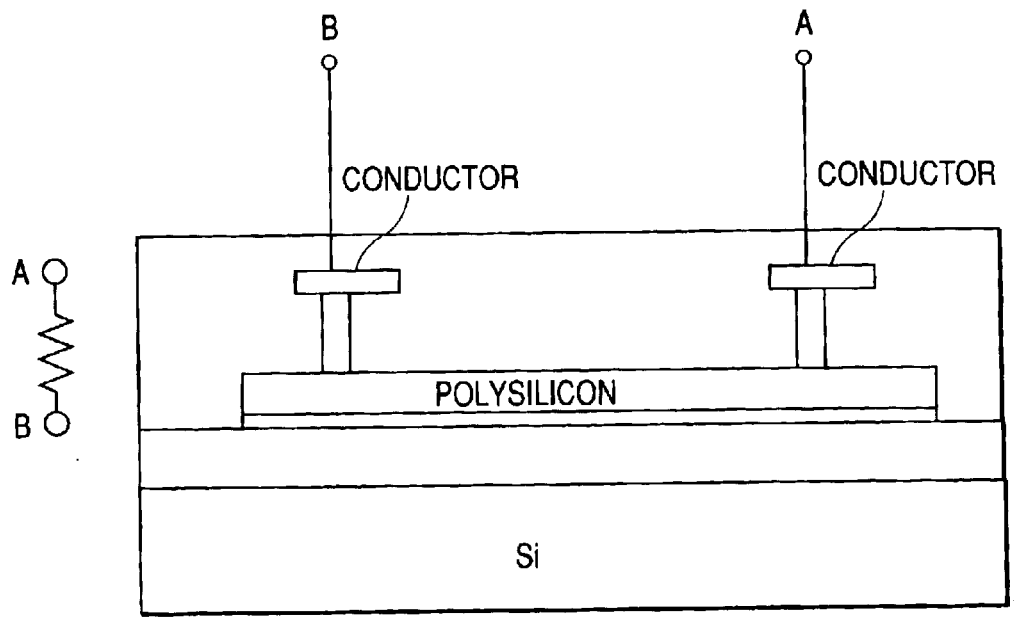
FIG. 12 is a device structure sectional view depicting one embodiment of a resistive element provided in a semiconductor integrated circuit device according to the present invention.

A device structure sectional view showing one embodiment of a resistive element provided in a semiconductor integrated circuit device according to the present invention is shown in FIG. 12. The resistive element according to present embodiment is used for the resistor R1 or the like that constitutes the phase compensating circuit of FIG. 5. A polysilicon layer is formed on a field insulating film formed on a silicon substrate, and is used as a resistive element. A semiconductor impurity for constituting the resistive element is introduced into the polysilicon layer.

Figure 13:
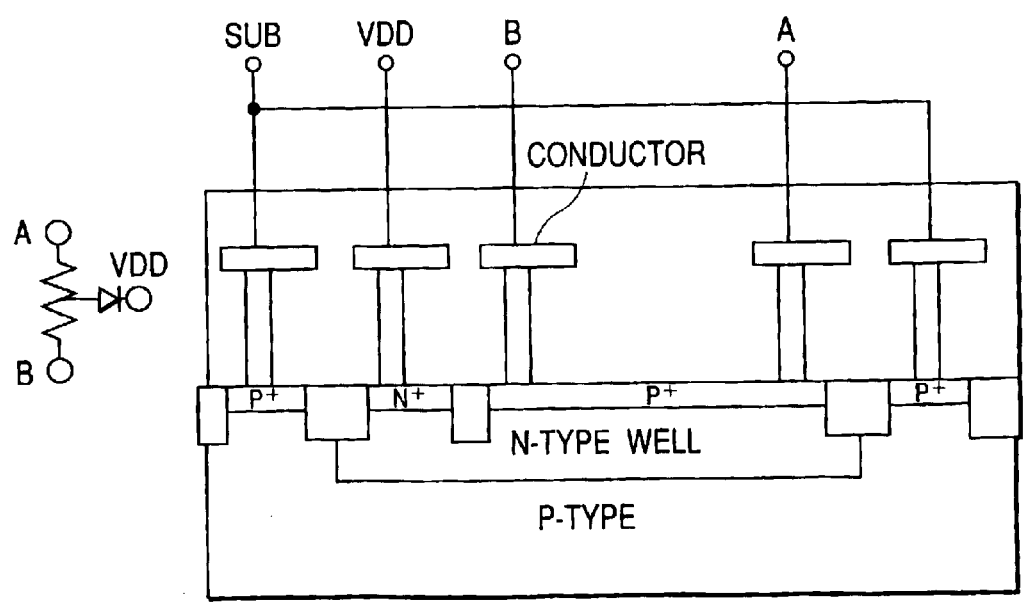
FIG. 13 is a device structure sectional view showing another embodiment of a resistive element provided in a semiconductor integrated circuit device according to the present invention.

A device structure sectional view showing another embodiment of a resistive element provided in a semiconductor integrated circuit device according to the present invention is shown in FIG. 13. The resistive element according to the present embodiment is used for the resistor R1 or the like that constitutes the phase compensating circuit of FIG. 5. In the present embodiment, a diffusion layer is used as the resistive element. Although not restricted in particular, a P+ type diffusion layer similar to the source and drain of a P-channel type MOSFET is formed on an N-type WELL (well) region formed on the surface of a P-type semiconductor substrate and is used as the resistive element. Incidentally, a power supply voltage VDD is applied to the N-type WELL as a bias voltage, and the P-type semiconductor substrate is supplied with a substrate bias voltage SUB like a ground potential. In order to supply the power supply voltage VDD, the N-type WELL is provided with an N+ diffusion layer. In order to supply the voltage SUB, P+ diffusion layers are provided on the surface of the substrate.

Figure 14:
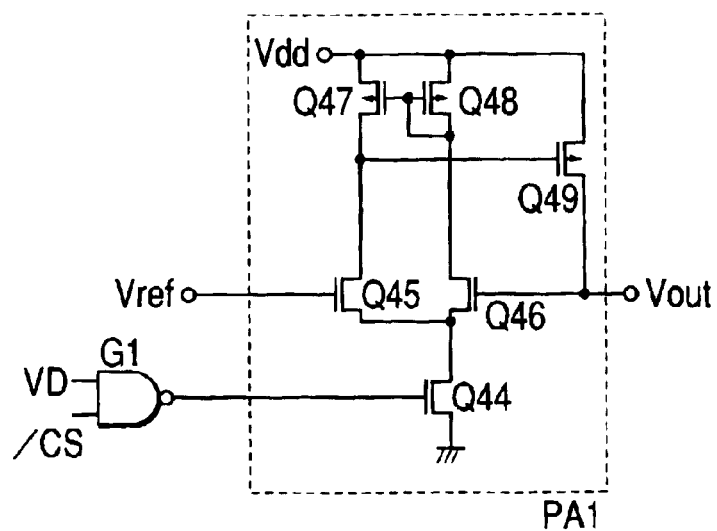
FIG. 14 is a circuit diagram illustrating one embodiment of a negative feedback amplifier circuit provided in a semiconductor integrated circuit device according to the present invention.

A circuit diagram illustrating one embodiment of a negative feedback amplifier circuit provided in a semiconductor integrated circuit device according to the present invention is shown in FIG. 14. The negative feedback amplifier circuit according to the present embodiment is a specific circuit of the negative feedback amplifier circuit PA1 shown in FIG. 8. Such a current source MOSFET Q44 as described above forms an operating current for differential MOSFETs Q45 and Q46. A load circuit comprising P-channel type MOSFETs Q47 and Q48 provided in a current mirror configuration is provided at the drains of these MOSFETs Q45 and Q46. An output voltage of this differential circuit is outputted through a P-channel type output MOSFET Q49. A voltage follower operation is performed that feeds back a drain output of the MOSFET Q49 to the gate of the differential MOSFET Q46, and applies a reference voltage Vref to the gate of the differential MOSFET Q45, thereby forming an output voltage Vout corresponding to the reference voltage Vref.

Figure 15:
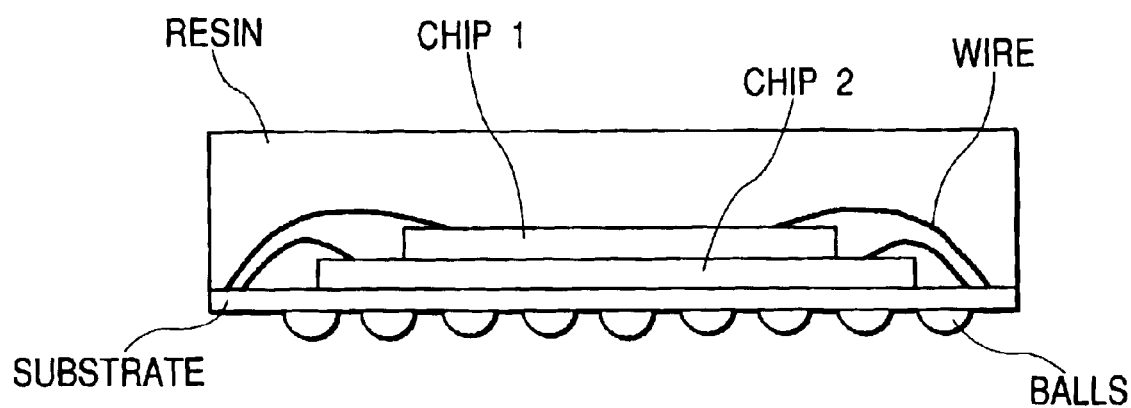
FIG. 15 is a configurational diagram showing one embodiment of a semiconductor integrated circuit device according to the present invention.

A configurational diagram showing one embodiment of a semiconductor integrated circuit device according to the present invention is shown in FIG. 15. The present embodiment is intended for a case in which the semiconductor integrated circuit device is configured by a laminated package. For instance, a chip 1 and a chip 2 are packaged or mounted on a substrate in an overlapped form. In this case, a laminated structure is taken in which when the chip 2 is small in chip size, for example, the chip 1 is provided with such a chip small in chip size being turned up. The substrate is connected to the respective chips by bonding wires.

One semiconductor memory device is configured with a flash memory employed in the portable apparatus operated by being battery-driven as the chip 1, and an SRAM as the chip 2. When a fast memory operation is performed, for example, access can be made to the SRAM and access can be made to data to be non-volatilized in the flash memory. By equipping one semiconductor integrated circuit device with the two types of memory chips, they becomes suitable for a portable electronic apparatus that requires a size and weight reduction.

Figure 16:
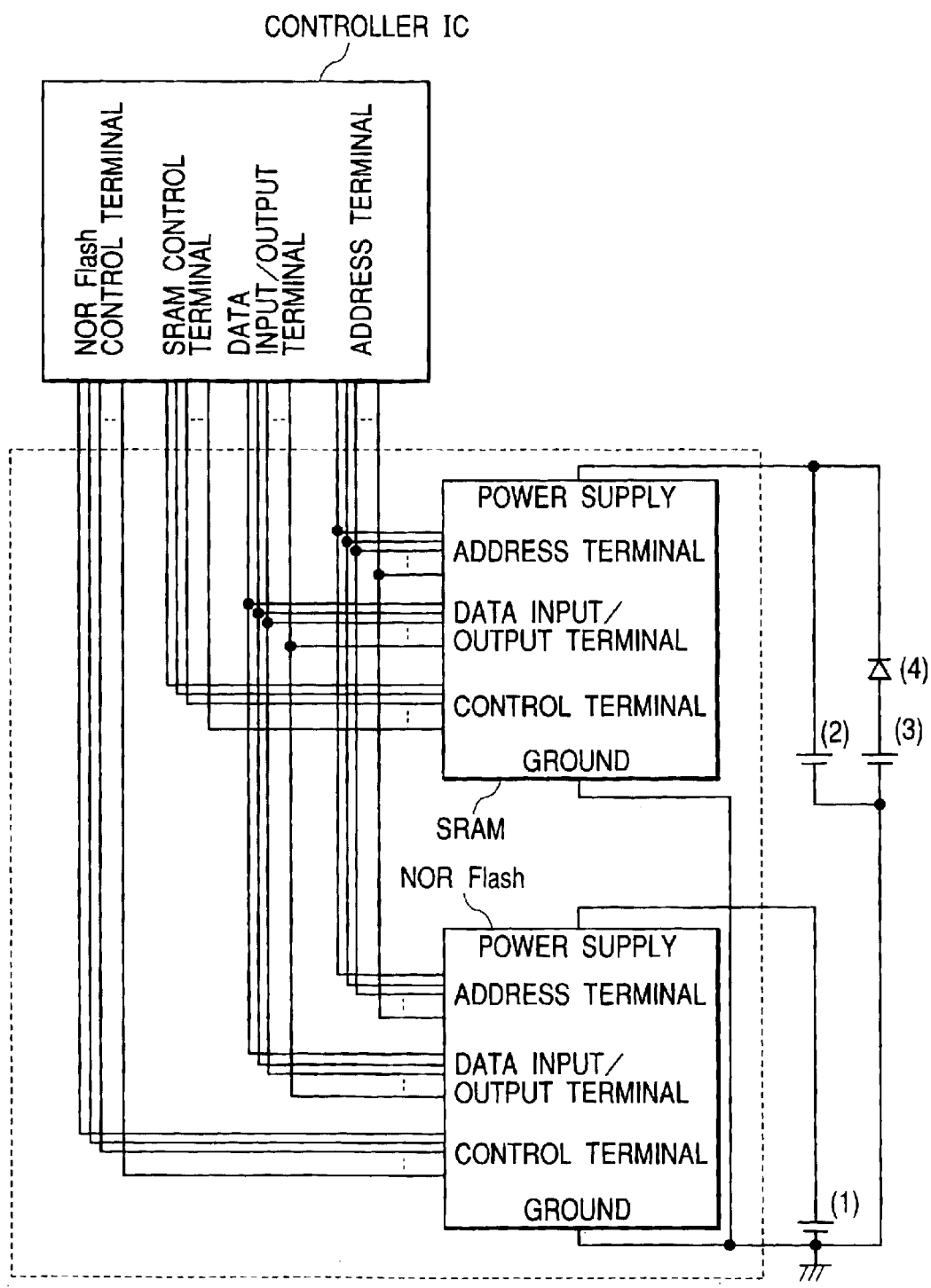
FIG. 16 is a block diagram depicting one embodiment of electronic equipment using a semiconductor integrated circuit device according to the present invention.

A block diagram showing one embodiment of electronic equipment using a semiconductor integrated circuit device according to the present invention is shown in FIG. 16. Although not restricted in particular, the electronic equipment according to the present embodiment is intended for a portable electronic apparatus.

The electronic equipment according to the present embodiment comprises a controller IC, a NOR flash memory, and an SRAM (Static RAM). The controller IC is made up of a one-chip microcomputer, for example. Data terminals of respective ICs are connected to one another by data buses comprising a plurality of signal lines. Address signals outputted from address terminals of the controller IC are supplied to their corresponding address terminals of the two memory chips via an address bus. The controller IC has control terminals intended for the two memory chips and is connected to control terminals of the respective memory chips via control buses.

Although not restricted in particular, when the controller IC obtains access to the NOR flash memory, an address signal supplied from the corresponding address terminal and a control signal supplied from the corresponding control terminal are supplied. If a write operation for instructing writing is given from the control signal, then write data is inputted from the corresponding data terminal of the controller IC to its corresponding data terminal of the flash memory. If a read operation for instructing reading is given from the control signal, then read data outputted from the flash memory is inputted to its corresponding data terminal of the controller IC.

Although not restricted in particular, when the controller IC obtains access to the SRAM, an address signal supplied from the corresponding address terminal and a control signal supplied from the corresponding control terminal are supplied. If a write operation for instructing writing is given from the control signal, then write data is inputted from the corresponding data terminal of the controller IC to its corresponding data terminal of the SRAM. If a read operation for instructing reading is given from the control signal, then read data outputted from the SRAM is inputted to its corresponding data terminal of the controller IC.

In the present embodiment, although not restricted in particular, the supply of a voltage from a system power supply (2) to a power terminal and a voltage from a backup battery (3) thereto via a backflow preventing diode (4) is performed to non-volatilize memory information of the SRAM. A power supply voltage is supplied from a system power supply (1) to the flash memory. As the backup battery (3), a button battery small in battery capacity is used. Therefore, it is necessary to reduce a current consumed by the SRAM as small as possible upon a backup operation of memory information by such a battery for the purpose of increasing the life of the battery.

For example, the system power supply (2) is interrupted or shut off and the SRAM is held in a standby state to thereby retain memory information by the battery backup. When the controller IC effects writing and reading on the flash memory in a supplied state of the system power supply (2), large noise occurs in the system power supply (1) and the ground potential due to an operating current flowing in such a memory or an operating current or the like flowing in the controller IC. Since the above-described system power supply (2) in the SRAM is separated and interrupted from the system power supply (1), no noise is placed on the power terminal. Since, however, the ground potential is used in common, noise is placed on the ground potential upon effecting writing and reading on the flash memory by the controller IC. Therefore, the stabilization of a step-down voltage Vout by the above-described negative feedback amplifier circuit PA2 is achieved upon such standby, thus resulting in utility for the purpose of holding memory information.

When the SRAM is held in a standby state and writing and reading are effected on the flash memory in a configuration wherein the system power supply is supplied commonly to the power terminals of the flash memory and the SRAM, power noise produced upon access to the flash memory is transferred even to the SRAM. Therefore, the stabilization of the step-down voltage Vout by the above-described negative feedback amplifier circuit PA2 provided for the SRAM is achieved upon such standby, thus resulting in utility for the purpose of retaining memory information.

While the invention made above by the present inventors has been described specifically by the illustrated embodiments, the invention of the present application is not limited to the embodiments. It is needless to say that various changes can be made thereto within the scope not departing from the substance thereof. For example, a reference voltage is set to a voltage lower than a step-down voltage, and a voltage amplifying operation may be carried out by a negative feedback amplifier circuit. In this case, the gain of a voltage can be set according to the amount of feedback. If ½ of an output voltage is fed back, then a reference voltage can be reduced to ½ of the output voltage.

The inventors of the present application and the present applicant have recognized that the specification of the present application includes the inventions comprising constituent elements like the following (1) through (9) in addition to the inventions specified by claims.

(1) A semiconductor integrated circuit device, comprising:
  a first power terminal which receives a first power supply voltage;
  an internal voltage generating circuit which converts the first power supply voltage to a second power supply voltage;
  an internal circuit operated in response to the second power supply voltage; and
  a ground terminal which receives a ground potential,
  wherein the internal voltage generating circuit includes a first MOSFET, a second MOSFET, a first current source connected to common sources of the first and second MOSFETs, a load circuit provided between the first and second MOSFETs and the external power terminal, a third MOSFET which outputs the internal voltage, based on at least one output signal of the first and second MOSFETs, and a fourth MOSFET which constitutes a capacitive element, wherein a reference voltage is supplied to a gate of the first MOSFET, and a signal based on the output signal of the third MOSFET is inputted to a gate of the second MOSFET, wherein a gate of the fourth MOSFET functions as one electrode of the capacitive element, and a common node to which a source and drain of the fourth MOSFET are connected, functions as the other electrode of the capacitive element, and wherein the capacitive element is connected between the common sources and the first power terminal.

(2) A semiconductor integrated circuit device, comprising:

a first power terminal which receives a first power supply voltage;

a voltage generating circuit which outputs a second power supply voltage lower than the first power supply voltage; and a ground terminal which receives a ground potential, wherein the voltage generating circuit includes a first MOSFET, a second MOSFET, a third MOSFET having a source-drain path between common sources of the first and second MOSFETs and the ground terminal, a load circuit provided between the first and second MOSFETs and the first power terminal, a drive circuit which forms a voltage to be supplied to a gate of the third MOSFET, and a fourth MOSFET which outputs the second power supply voltage, based on a signal obtained from the load circuit, wherein a reference voltage is supplied to a gate of the first MOSFET, and a signal based on the output signal of the fourth MOSFET is inputted to a gate of the second MOSFET, and wherein the drive circuit includes a fifth MOSFET which constitutes a capacitive element, and a gate of the fifth MOSFET functions as one electrode of the capacitive element, a common node to which a source and drain of the fifth MOSFET are connected, functions as the other electrode of the capacitive element, and the capacitive element is connected between the common sources and the first power terminal.

(3) A semiconductor integrated circuit device, comprising:

a first power terminal which receives a first power supply voltage;

a ground terminal which receives a ground potential; and a voltage generating circuit which forms a second power supply voltage lower than the first power supply voltage, wherein the internal voltage generating circuit includes a first MOSFET, a second MOSFET, a current source connected to common sources of the first and second MOSFETs, a load circuit provided between the first and second MOSFETs and the first power terminal, a capacitive element connected between the common sources and the ground terminal, and a third MOSFET which outputs the second power supply voltage, based on a signal obtained from the load circuit, wherein a reference voltage is supplied to a gate of the first MOSFET, and a signal based on the output signal of the third MOSFET is inputted to a gate of the second MOSFET, wherein a variation in the ground potential is transferred to the common sources via the capacitive element, wherein the current source includes a fourth MOSFET having a source connected to the common sources and a drain connected to the ground terminal, and when the ground potential varies in a direction in which a difference between the first power supply voltage and the ground potential becomes small, a charge current provided for the capacitive element through the fourth MOSFET increases.

(4) A semiconductor integrated circuit device, comprising:

a first power terminal which receives a first power supply voltage;

a second power terminal which receives a second power supply voltage;

a negative feedback amplifier circuit which converts the first power supply voltage to an internal voltage; and an internal circuit which receives the internal voltage and the second power supply voltage as power supply voltages, wherein the negative feedback amplifier circuit is provided with a first MOSFET of first conductivity type, a second MOSFET of first conductivity type, a third MOSFET of second conductivity type having a source-drain path between common sources of the first and second MOSFETs and the second power terminal, and a capacitive element connected between the common sources and the first power terminal.

(5) A semiconductor integrated circuit device, comprising:

a first power terminal which receives a first power supply voltage;

a second power terminal which receives a second power supply voltage;

a negative feedback amplifier circuit which converts the first power supply voltage to an internal voltage; and an internal circuit which receives the internal voltage and the second power supply voltage as power supply voltages, wherein the negative feedback amplifier circuit is provided with a first MOSFET of first conductivity type, a second MOSFET of first conductivity type, a third MOSFET of second conductivity type having a source-drain path between common sources of the first and second MOSFETs and the first power terminal, and a capacitive element connected between the common sources and the second power terminal.

(6) A semiconductor integrated circuit device, comprising:

a first power terminal which receives a first power supply voltage;

a first negative feedback amplifier circuit and a second negative feedback amplifier circuit each of which forms a second power supply voltage lower than the first power supply voltage; and an internal circuit provided with the second power supply voltage as a power supply, wherein the first negative feedback amplifier circuit includes a first MOSFET, a second MOSFET, a first current source connected to common sources of the first and second MOSFETs, and a first load circuit connected to the first and second MOSFETs, wherein the second negative feedback amplifier circuit includes a third MOSFET, a fourth MOSFET, a second current source connected to common sources of the third and fourth MOSFETs, a second load circuit connected to the third and fourth MOSFETs and a capacitive element, wherein a current value of the first current source is set larger than a current value of the second current source, and one end of the capacitive element is connected to the common sources of the third and fourth MOSFETs such that a capacitance connected to the common sources of the third and fourth MOSFETs becomes larger than a capacitance connected to the common sources of the first and second MOSFETs.

(7) A semiconductor integrated circuit device wherein the first negative feedback amplifier circuit is deactivated based on a standby state of the internal circuit described in the paragraph (6).

(8) A semiconductor integrated circuit device including a comparator which compares the second power supply voltage and a reference value, wherein when the internal circuit is in a standby state, the first negative feedback amplifier circuit is operated based on the output of the comparator.

(9) A semiconductor integrated circuit device, comprising:

a first power terminal which receives a first power supply voltage;

a ground terminal which receives a ground potential; and a negative feedback amplifier circuit which forms a second power supply voltage lower than the first power supply voltage, wherein the negative feedback amplifier circuit has a pair of differential MOSFETs, and wherein an operating current of the negative feedback amplifier circuit is made great even in the case of both voltage variations in the directions in which the difference between the first power supply voltage and the ground potential becomes small and large.

An advantageous effect obtained by a typical one of the inventions disclosed in the present application will be described in brief as follows. An advantageous effect is obtained in that a constant current source is used to cause a bias current for setting current consumption to flow in each differential amplifying MOSFET, a capacitor is provided between an external power supply voltage and a predetermined circuit node to thereby detect a reduction in the external power supply voltage, and an operating current of the differential amplifying MOSFET is increased through the use of a current flowing in the capacitor due to such an external power variation to thereby execute the operation of stabilizing an output voltage corresponding to the reduction in the external power supply voltage, whereby an output voltage stable for variations in power supply voltage and ground potential can be obtained while a reduction in power consumption is being achieved.

What is claimed is:

1. A semiconductor integrated circuit device, comprising:
an external power terminal;
an external ground terminal;
an internal voltage generating circuit which converts an external voltage supplied from the external power terminal to an internal voltage; and an internal circuit which receives the internal voltage as a power supply voltage, wherein the internal voltage generating circuit includes a first MOSFET of first conductivity type, a second MOSFET of first conductivity type, a first current source connected to common sources of the first and second MOSFETs, a load circuit provided between at least one drain of the first and second MOSFETs and the external power terminal, a capacitive element connected between the common sources and the external power terminal, and a third MOSFET which outputs the internal voltage based on at least one output signal of the first and second MOSFETs, wherein the first MOSFET has a gate supplied with a reference voltage and the second MOSFET has a gate inputted with a signal based on the internal voltage output by the third MOSFET, and wherein the first current source includes a fourth MOSFET of second conductivity type having a source-drain path between the common sources and the external ground terminal.

2. The semiconductor integrated circuit device according to claim 1, wherein the load circuit includes a fifth MOSFET of second conductivity type having a source-drain path between the drain of the first MOSFET and the external power terminal, and a sixth MOSFET of second conductivity type having a source-drain path between the drain of the second MOSFET and the external power terminal.

3. The semiconductor integrated circuit device according to claim 2, wherein the internal voltage generating circuit prior includes: a seventh MOSFET of first conductivity type having a gate connected to the gate of the first MOSFET and a drain connected to the drain of the first MOSFET; an eighth MOSFET of first conductivity type having a gate connected to the gate of the second MOSFET, a drain connected to the drain of the second MOSFET, and a source connected to a source of the seventh MOSFET; and a second current source connected to common sources of the seventh and eighth MOSFETs.

4. The semiconductor integrated circuit device according to claim 3, wherein the second current source includes a ninth MOSFET of second conductivity type having a source-drain path between the common sources of the seventh and eighth MOSFETs and the external ground terminal.

5. A semiconductor integrated circuit device, comprising:
a first power terminal which receives a first power supply voltage;
a ground terminal which receives a ground potential; and
a voltage generating circuit which forms a second power supply voltage lower than the first power supply voltage, wherein the voltage generating circuit includes a first MOSFET, a second MOSFET, a current source connected to common sources of the first and second MOSFETs, a load circuit provided between the first and second MOSFETs and the first power terminal, a capacitive element connected between the common sources and the first power terminal, and a third MOSFET which outputs the second power supply voltage based on a signal obtained from the load circuit, wherein a reference voltage formed with the ground potential as the reference is supplied to a gate of the first MOSFET, wherein a signal based on an output signal of the third MOSFET is inputted to a gate of the second MOSFET, wherein a variation in external voltage with respect to the ground potential is transferred to the common sources through the capacitive element, wherein when the first power supply voltage varies in a direction in which a difference between the first power supply voltage and the ground potential becomes small, a difference between a voltage at the common sources and the reference voltage is set large, and wherein when the first power supply voltage varies in a direction in which the difference between the first power supply voltage and the ground potential becomes large, a difference between the voltage at the common sources and the reference voltage is set small.

6. The semiconductor integrated circuit device according to claim 5, wherein the current source includes a fourth MOSFET having a gate supplied with a bias voltage formed with the ground potential as the reference, a source connected to the common sources, and a drain connected to the ground terminal, and when the first power supply voltage varies in the direction in which the difference between the first power supply voltage and the ground potential becomes small, a charge current provided for the capacitive element through the fourth MOSFET increases.

* * * * *